United States Patent
Noda

(10) Patent No.: US 7,887,632 B2
(45) Date of Patent: Feb. 15, 2011

(54) PROCESS FOR PRODUCING MONOCRYSTAL THIN FILM AND MONOCRYSTAL THIN FILM DEVICE

(75) Inventor: Suguru Noda, Kohtoh-ku (JP)

(73) Assignee: Japan Science and Technology Agency, Kawaguchi, shi (JP)

( * ) Notice: Subject to any disclaimer, the term of this patent is extended or adjusted under 35 U.S.C. 154(b) by 1078 days.

(21) Appl. No.: 10/585,731

(22) PCT Filed: Dec. 22, 2004

(86) PCT No.: PCT/JP2004/019195

§ 371 (c)(1), (2), (4) Date: Jan. 4, 2007

(87) PCT Pub. No.: WO2005/069356

PCT Pub. Date: Jul. 28, 2005

(65) Prior Publication Data
US 2008/0202582 A1 Aug. 28, 2008

(30) Foreign Application Priority Data
Jan. 15, 2004 (JP) .............................. 2004-007754

(51) Int. Cl.
*C30B 1/02* (2006.01)
(52) U.S. Cl. ...................... 117/4; 117/8; 117/9; 117/86

(58) Field of Classification Search ...................... 117/4, 117/8, 9, 86, 90, 105
See application file for complete search history.

(56) References Cited

U.S. PATENT DOCUMENTS
2004/0217434 A1* 11/2004 Lee et al. ..................... 257/412

FOREIGN PATENT DOCUMENTS
JP 10 200080 7/1998
WO 02 40751 5/2002

* cited by examiner

*Primary Examiner*—Robert M Kunemund
(74) *Attorney, Agent, or Firm*—Oblon, Spivak, McClelland, Maier & Neustadt, L.L.P.

(57) ABSTRACT

The present invention provides a method for manufacturing a monocrystalline film and a device formed by the above method, and according to the method mentioned above, lift-off of the monocrystalline silicon film is preferably performed and a high-purity monocrystalline silicon film can be obtained. A monocrystalline silicon substrate (template Si substrate) 201 is prepared, and on this monocrystalline silicon substrate 201, an epitaxial sacrificial layer 202 is formed. Subsequently, on this sacrificial layer 202, a monocrystalline silicon thin film 203 is rapidly epitaxially-grown using a RVD method, followed by etching of the sacrificial layer 202, whereby a monocrystalline silicon thin film 204 used as a photovoltaic layer of solar cells is formed.

42 Claims, 13 Drawing Sheets

(a)

(b)

(c)

(d)

PROCESS FOR PRODUCING MONOCRYSTAL THIN FILM AND MONOCRYSTAL THIN FILM DEVICE

TECHNICAL FIELD

The present invention relates to a method for manufacturing a monocrystalline thin film and a monocrystalline thin film device manufactured using the above method, and more particularly, relates to a method for manufacturing a high-purity monocrystalline silicon thin film for solar cells and a solar cell containing the monocrystalline silicon thin film manufactured by the above method.

BACKGROUND ART

Hereinafter, conventional methods for manufacturing a monocrystalline silicon thin film will be described.

(a) Oxygen Ion Implantation Method

Oxygen ions are implanted into a monocrystalline silicon substrate, followed by heat treatment, so that a layered structure is formed which is composed of monocrystalline silicon, silicon dioxide, and the monocrystalline silicon substrate.

However, when oxygen ions are implanted into the monocrystalline silicon substrate, problems may arise in that many defects are generated in upper-side monocrystalline silicon and the cost of ion implantation is high (see Patent Document 1 below).

(b) Hydrogen Ion Implantation Method

After hydrogen ions ($H^+$ and $H^-$) are implanted into a monocrystalline silicon substrate, this substrate is adhered to a support substrate, followed by heat treatment. Subsequently, a layer implanted with the hydrogen ions is destroyed and is then peeled away, so that a monocrystalline silicon thin film having a thickness on the order of submicrons can be formed on the support substrate.

Since implanted hydrogen can only reach a depth on the order of submicrons, for example, in solar cell applications, the thickness of the monocrystalline silicon thin film must be increased to approximately 10 µm by a chemical vapor deposition or a physical vapor deposition method at a temperature of 1,000° C. or more. However, it is difficult to obtain an inexpensive substrate which can satisfy requirements for heat resistance and coefficient of thermal expansion. In addition, a method for increasing the thickness of a monocrystalline silicon thin film before a hydrogen ion implanted layer is peeled away from a substrate cannot be realized since the hydrogen ion implanted layer is destroyed under the film-thickening conditions (see Patent Document 2 below).

(c) Porous Silicon Method

When a surface of a monocrystalline silicon substrate is anodized, fine pores can be formed at a high density. After oxidation treatment is performed on surfaces of the fine pores thus formed, followed by removing parts of oxide layers which are close to the external surface with hydrofluoric acid, annealing is performed in a hydrogen atmosphere. As a result, the top-most surface again forms a continuous monocrystalline film, so that a structure containing a great number of voids is formed thereunder. After this substrate thus treated is adhered to a support substrate, when the layer containing voids is chemically dissolved using a liquid phase method or is mechanically destroyed by water jet or the like, a monocrystalline silicon thin film can be separated (see Patent Document 3 below).

However, the thickness of the upper-side silicon film is only approximately 1 µm which is a thickness to be contributed by the surface tension, and when this silicon is used in solar cells, the thickness must be increased by a CVD method. Furthermore, when peeling is performed by mechanical destruction, the monocrystalline silicon substrate is also damaged, and hence a problem may arise in some cases in that the repeated use of the monocrystalline silicon substrate is limited. In addition, a large number of steps are required, and the process is also disadvantageously complicated.

(d) Melting Recrystallization Method/Melting Crystallization Method

When a silicon dioxide film, a polycrystalline or an amorphous silicon thin film, and a protective layer made of silicon dioxide are laminated in that order on a silicon substrate, and scanning of a line-shaped melting zone by lamp heating or the like is performed, a polycrystalline silicon thin film can be formed in which crystal grains are well grown in the in-plane direction. Subsequently, after the protective layer is chemically dissolved, and the thickness of the polycrystalline silicon thin film is increased by a CVD method, etching of the silicon dioxide film is performed with hydrofluoric acid, so that the polycrystalline silicon thin film can be separated (see Patent Document 4 below).

However, since the thin layer thus obtained is merely a polycrystalline silicon thin film, besides inferior energy conversion efficiency, the silicon substrate is also disadvantageously degraded while the molten zone is scanned, and in addition, the process is complicated due to a great number of manufacturing steps.

(e) Epitaxial Lift-Off (ELO) Method Using Sacrificial Layer Having Different Elemental Composition An epitaxial lift-off (ELO) method is a method for obtaining a monocrystalline thin film, that is a target material, comprising the steps of preparing a monocrystalline substrate used as a template, forming a sacrificial layer thereon by epitaxial growth, forming a target film on the sacrificial layer by epitaxial growth, and removing the sacrificial layer.

Incidentally, when being used for solar cells, a monocrystalline silicon thin film exhibits superior energy conversion efficiency, safety, stability and the like; however, the cost is disadvantageously high. As ultra pure silicon used for solar cells, substandard silicon which is a part of silicon produced in semiconductor industries has been procured at an inexpensive price; however, the ratio of the cost of silicon substrates is still high, and in addition, in recent years, the surplus of silicon in semiconductor industries is getting short to meet the rapidly growing silicon consumption in the solar cell industry. Accordingly, when the substrates made from monocrystalline silicon can be replaced with thin films made therefrom, problems of the cost and supply of raw materials can be solved.

Accordingly, the inventor of the present invention proposed a method for manufacturing a monocrystalline silicon thin film by an ELO method (see Patent Document 5 below). In this method, it was proposed that when a metal silicide, a doped silicon layer or the like, that is "a material having a different elemental composition", is used as a sacrificial layer, the ELO method may also be applied to silicon.

In particular, on a monocrystalline silicon substrate, a layer having a composition different from pure silicon, that is, metal silicide or highly doped silicon is epitaxially-grown as the sacrificial layer (intermediate layer), and silicon is then further epitaxially-grown thereon to form a monocrystalline silicon thin film, followed by removal of the sacrificial layer by chemical etching, so that the monocrystalline silicon substrate and the monocrystalline silicon thin film are separated from each other. Accordingly, the method was proposed in which while the monocrystalline silicon substrate is being reused, the monocrystalline silicon thin films are manufactured.

However, the method using the sacrificial layer as described above also has problems. That is, when a material such as metal silicide is used, impurities are incorporated into the monocrystalline silicon thin film, and hence a problem of the decreased energy conversion efficiency of solar cells occurs. On the other hand, when a doped silicon layer is used, in the process of forming the monocrystalline silicon thin film by epitaxial growth, a dopant diffuses in the monocrystalline silicon thin film and the substrate directions, and as a result, a problem has occurred in that a highly doped layer cannot be maintained.

Patent Document 1: Japanese Unexamined Patent Application Publication No. 2000-077352

Patent Document 2: Japanese Unexamined Patent Application Publication No. 11-040785

Patent Document 3: Japanese Unexamined Patent Application Publication No. 05-275663

Patent Document 4: Japanese Unexamined Patent Application Publication No. 07-226528

Patent Document 5: WO0240751

DISCLOSURE OF INVENTION

The above-described ELO method (e) using a sacrificial layer having a different composition will be further described in detail, and in addition, problems of this method will also be described.

FIG. 1 includes cross-sectional views (part 1) showing a process for manufacturing a monocrystalline silicon film by the ELO method described above which uses a sacrificial layer having a different composition.

(1) First, a monocrystalline silicon substrate 1 is prepared as shown in FIG. 1(a).

(2) Next, as shown in FIG. 1(b), on the surface of the monocrystalline silicon substrate 1, a metal silicide ($MSi_x$: M indicates a metal in this case) film 2 is epitaxially-grown as an intermediate layer (sacrificial layer).

(3) Next, as shown in FIG. 1(c), a monocrystalline silicon film 3 is epitaxially-grown on the surface of the sacrificial layer 2.

(4) Subsequently, as shown in FIG. 1(d), the metal silicide layer 2 is removed by etching, so that the monocrystalline silicon film 3 is separated.

FIG. 2 includes cross-sectional views (part 2) showing a process for manufacturing a monocrystalline silicon film by the ELO method using a sacrificial layer having a different composition.

(1) As shown in FIG. 2(a), first of all, a monocrystalline silicon substrate 11 is prepared.

(2) Next, as shown in FIG. 2(b), a highly doped silicon layer 12 is epitaxially-grown as an intermediate layer (sacrificial layer) on the surface of the monocrystalline silicon substrate 11, or doping is performed onto the surface thereof so as to form an intermediate layer (sacrificial layer).

(3) Next, as shown in FIG. 2(c), on the surface of the highly doped silicon film 12, a monocrystalline silicon film 13 is epitaxially-grown.

(4) Subsequently, as shown in FIG. 2(d), the highly doped silicon film 12 is removed by etching, so that the monocrystalline silicon film 13 is separated.

However, according to the methods for manufacturing a monocrystalline silicon film described above, there have been the following problems.

(A) According to the above-described method for manufacturing a monocrystalline silicon film shown in FIG. 1, when the metal silicide ($CoSi_2$, $NiSi_2$, or $CrSi_2$) film 2 is used as the sacrificial layer, selective etching of this metal silicide film 2 can be easily performed with an aqueous HF solution as an etching agent; however, metal atoms are incorporated into the monocrystalline silicon film 3, and hence a high-purity monocrystalline silicon film cannot be manufactured.

In particular, when a monocrystalline silicon thin film is used as a photovoltaic layer of solar cells, even when a very small amount of metal elements, such as 0.1 ppm or less, is contained, the energy conversion efficiency of a solar cell is seriously degraded.

(B) According to the above-described method for manufacturing a monocrystalline silicon film shown in FIG. 2, when the highly doped silicon film 12 doped with a dopant such as B or P (p-type or n-type can be obtained, respectively, and the resistivity is less than $10^{-2}$ $\Omega \cdot cm$) is formed as the sacrificial layer, and $HF/HNO_3/CH_3COOH$ is used as an etching agent, the incorporation of dopant into the monocrystalline silicon film 13 does not cause a problem; however, when the monocrystalline silicon film 13 is epitaxially-grown, the distribution of the dopant becomes very broad because of the diffusion thereof, and as a result, a problem may arise in that the lift-off of the monocrystalline silicon film 13 is not ideally performed.

In particular, when the monocrystalline silicon thin film 13 is epitaxially-grown on the sacrificial layer (highly doped silicon film 12), a certain period of time is required for the growth, and during this period, the dopant contained in the sacrificial layer 12 diffuses, so that a problem occurs in that the layered structure cannot be maintained (see FIG. 4).

FIG. 4 includes schematic views for illustrating the diffusion of a dopant during the epitaxial growth of a monocrystalline silicon thin film on the structure composed of a highly doped silicon sacrificial layer and a monocrystalline silicon substrate, the diffusion being a conventional problem. FIG. 4(a) includes ideal views of targeted film structure and dopant concentration distribution, FIG. 4(b) includes views of actual film structure and dopant concentration distribution, and the state is shown in which the three-layered structure cannot be maintained due to the diffusion of the dopant during the epitaxial growth.

Hence, according to the present invention, an object is to provide a method for manufacturing a monocrystalline thin film and a monocrystalline thin film device manufactured by the method mentioned above, the above method being capable to solve the problems described above, to preferably perform the lift-off of the monocrystalline silicon film, and to obtain a high-purity monocrystalline silicon film for solar cells.

[1] In a method for manufacturing a monocrystalline thin film, a monocrystalline thin film containing a small number of crystal defects is manufactured by the steps of (a) preparing a monocrystalline substrate; (b) forming a sacrificial layer containing crystal defects on the monocrystalline substrate using the same material by epitaxial growth; (c) forming a monocrystalline thin film containing crystal defects on the sacrificial layer using the same material by epitaxial growth, the number of the crystal defects being smaller than that of the sacrificial layer; and (d) etching the sacrificial layer.

[2] In the method for manufacturing a monocrystalline thin film, according to the above [1], following the step (b), crystal defects present on the surface of the sacrificial layer are eliminated.

[3] In the method for manufacturing a monocrystalline thin film, according to the above [1] or [2], the monocrystalline substrate is a monocrystalline silicon substrate, the sacrificial layer is a silicon sacrificial layer, and the monocrystalline thin film is a monocrystalline silicon thin film.

[4] In the method for manufacturing a monocrystalline thin film, according to the above [1] or [2], the monocrystalline substrate is a monocrystalline GaAs substrate.

[5] In the method for manufacturing a monocrystalline thin film, according to the above [1] or [2], the monocrystalline substrate is a monocrystalline MgO substrate.

[6] In the method for manufacturing a monocrystalline thin film, according to the above [1], the step (b) is performed by a physical vapor deposition method or a chemical vapor deposition method at a temperature of 400 to 1,200° C., so that a silicon sacrificial layer containing crystal defects is epitaxially-grown.

[7] In the method for manufacturing a monocrystalline thin film, according to the above [3] or [6], the crystal defects include twins, vacancies, interstitial atoms, edge dislocations, and screw dislocations.

[8] In the method for manufacturing a monocrystalline thin film, according to one of the above [3], [6] and [7], the number density of the crystal defects is $1/\mu m^2$ to $1/nm^2$ at the boundary between the monocrystalline silicon substrate and the silicon sacrificial layer.

[9] In the method for manufacturing a monocrystalline thin film, according to one of the above [3] and [6] to [8], twins exist at the boundary between the monocrystalline silicon substrate and the silicon sacrificial layer at a number density of $1/\mu m^2$ to $1/nm^2$.

[10] In the method for manufacturing a monocrystalline thin film, according to one of the above [3] and [6] to [9], following the step (b), thermal annealing is performed in a reducing atmosphere at a temperature of 1,000 to 1,400° C., so that crystal defects on the surface of the silicon sacrificial layer are eliminated.

[11] In the method for manufacturing a monocrystalline thin film, according to the above [10], after the thermal annealing, the number density of twins present on the surface of the silicon sacrificial layer is one hundredth or less of that of twins present at the boundary between the monocrystalline silicon substrate and the silicon sacrificial layer.

[12] In the method for manufacturing a monocrystalline thin film, according to one of the above [3] and [6] to [11], the step (c) is performed by a physical vapor deposition method or a chemical vapor deposition method at a temperature of 1,000 to 1,400° C., so that the monocrystalline silicon thin film containing a small number of crystal defects is formed by epitaxial growth.

[13] In the method for manufacturing a monocrystalline thin film, according to one of the above [3] and [6] to [12], after the monocrystalline silicon thin film is supported by a support base material following the step (c), the silicon sacrificial layer is etched away so as to manufacture the monocrystalline silicon thin film.

[14] In the method for manufacturing a monocrystalline thin film, according to one of the above [3] and [6] to [13], holes are formed in the monocrystalline silicon substrate at intervals.

[15] In the method for manufacturing a monocrystalline thin film, according to one of the above [3] and [6] to [14], the thickness of the silicon sacrificial layer is set to 100 nm or less so that roughness of the bottom surface of the monocrystalline silicon thin film is reduced to 100 nm or less.

[16] In the method for manufacturing a monocrystalline thin film, according to one of the above [3] and [6] to [14], the thickness of the silicon sacrificial layer is set to 100 nm or more so that the bottom surface of the monocrystalline silicon thin film has a texture structure of 100 nm or more.

[17] In the method for manufacturing a monocrystalline thin film, according to one of the above [3] and [6] to [16], a texture structure is formed on the surface of the monocrystalline silicon substrate.

[18] In the method for manufacturing a monocrystalline thin film, according to one of the above [3] and [6] to [17], the etching of the silicon sacrificial layer is performed using a mixed solution of hydrofluoric acid and an oxidizing agent.

[19] A monocrystalline thin film device is obtained by the method for manufacturing a monocrystalline thin film, according to one of the above [1] to [5].

[20] A monocrystalline thin film device obtained by the method for manufacturing a monocrystalline silicon thin film, according to one of the above [3] and [6] to [18].

[21] In the monocrystalline thin film device according to the above [20], the monocrystalline silicon thin film is a photovoltaic layer of solar cells.

[22] In the monocrystalline thin film device according to the above [20], the monocrystalline silicon thin film is a monocrystalline silicon thin film used for SOI (Silicon-On-Insulator).

[23] In a method for manufacturing a solar-cell monocrystalline silicon thin film, the solar-cell monocrystalline silicon thin film is produced by the steps of (a) preparing a monocrystalline silicon substrate; (b) forming an epitaxial sacrificial layer on this substrate; (c) rapidly forming a monocrystalline silicon thin film on the sacrificial layer by epitaxial growth, and (d) etching the sacrificial layer so as to manufacture a monocrystalline silicon thin film used as a photovoltaic layer of solar cells.

[24] In the method for manufacturing a solar-cell monocrystalline silicon thin film, according to the above [23], the monocrystalline silicon thin film is formed by epitaxial growth at a temperature T(° C.) and at a film growth rate GR ($\mu m/min$) which satisfies the condition of $GR > 2 \times 10^{12} \cdot \exp[-325(kJ/mol)/8.31(J/mol \cdot K)/(T+273)(K)]$, whereby the change in structure of the sacrificial layer is prevented.

[25] In the method for manufacturing a solar-cell monocrystalline silicon thin film, according to the above [23] or [24], the rapid epitaxial growth of the monocrystalline silicon thin film is performed by a physical vapor deposition.

[26] In the method for manufacturing a solar-cell monocrystalline silicon thin film, according to one of the above [23] to [25], the sacrificial layer is crystal silicon containing crystal defects.

[27] In the method for manufacturing a solar-cell monocrystalline silicon thin film, according to the above [26], the crystal defects includes twins, vacancies, interstitial atoms, edge dislocations, and screw dislocations.

[28] In the method for manufacturing a solar-cell monocrystalline silicon thin film, according to the above [26] or [27], the number density of the crystal defects is $1/\mu m^2$ to $1/nm2$ at the boundary between the monocrystalline silicon substrate and the silicon sacrificial layer.

[29] In the method for manufacturing a solar-cell monocrystalline silicon thin film, according to one of the above [25]

to [28], crystal defects on the surface of the sacrificial layer are eliminated following the step (b).

[30] In the method for manufacturing a solar-cell monocrystalline silicon thin film, according to one of the above [23] to [25], the sacrificial layer is highly doped monocrystalline silicon.

[31] In the method for manufacturing a solar-cell monocrystalline silicon thin film, according to the above [30], a dopant doped in the highly doped monocrystalline silicon is an element of group III or V.

[32] In the method for manufacturing a solar-cell monocrystalline silicon thin film, according to the above [30] or [31], the dopant concentration of the highly doped monocrystalline silicon is $10^{18}$ atoms/cm$^3$ or more.

[33] In the method for manufacturing a solar-cell monocrystalline silicon thin film, according to one of the above [30] to [32], a dopant source is supplied onto the surface of the monocrystalline silicon substrate, whereby the highly doped monocrystalline silicon sacrificial layer is formed.

[34] In the method for manufacturing a solar-cell monocrystalline silicon thin film, according to one of the above [30] to [32], a silicon source and a dopant source are simultaneously supplied onto the monocrystalline silicon substrate, whereby the highly doped monocrystalline silicon sacrificial layer is formed.

[35] In the method for manufacturing a solar-cell monocrystalline silicon thin film, according to one of the above [30] to [32], a silicon source and a dopant source are supplied onto the monocrystalline silicon substrate while the ratio between the above two sources is controlled with time so as to form a highly doped layer and a lightly doped layer in a silicon film which is rapidly epitaxially-grown, and the former is used as the sacrificial layer and the latter is used as the monocrystalline silicon thin film for a photovoltaic layer of solar cells.

[36] In the method for manufacturing a solar-cell monocrystalline silicon thin film, according to one of the above [23] to [25], the sacrificial layer comprises compound crystal containing silicon.

[37] In the method for manufacturing a solar-cell monocrystalline silicon thin film, according to the above [36], the compound crystal containing silicon is a metal silicide including CoSi$_2$, NiSi$_2$, or CrSi$_2$.

[38] In the method for manufacturing a solar-cell monocrystalline silicon thin film, according to one of the above [23] to [25], the sacrificial layer comprises crystal containing no silicon.

[39] In the method for manufacturing a solar-cell monocrystalline silicon thin film, according to one of the above [23] to [38], the sacrificial layer is etched using an aqueous solution containing hydrofluoric acid, whereby the monocrystalline silicon thin film used as a photovoltaic layer of solar cells is manufactured.

[40] In the method for manufacturing a solar-cell monocrystalline silicon thin film, according to one of the above [23] to [39], after the monocrystalline silicon thin film is supported by a support base material following the step (c), the silicon sacrificial layer is etched away, whereby the monocrystalline silicon thin film used as a photovoltaic layer of solar cells is manufactured.

[41] In the method for manufacturing a solar-cell monocrystalline silicon thin film, according to one of the above [23] to [40], holes are formed in the monocrystalline silicon substrate at intervals.

[42] In the method for manufacturing a solar-cell monocrystalline silicon thin film, according to one of the above [23] to [41], a texture structure is formed on the surface of the monocrystalline silicon substrate.

[43] A monocrystalline silicon thin film solar cell is obtained by the method for manufacturing a solar-cell monocrystalline silicon thin film, according to one of the above [23] to [42].

BEST MODE FOR CARRYING OUT THE INVENTION

Hereinafter, embodiments of the present invention will be described in detail.

Figure 1:
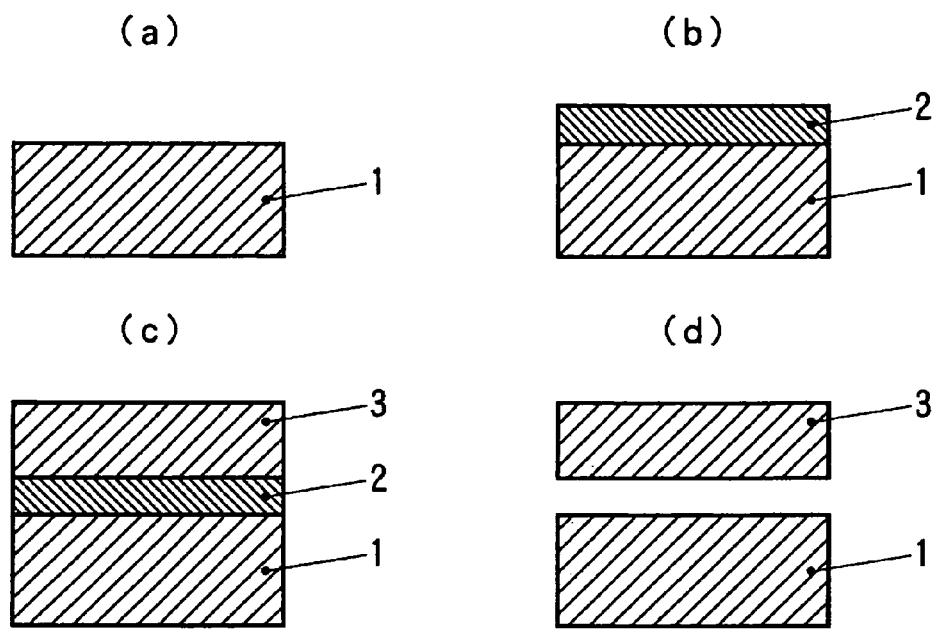
FIG. 1 includes cross-sectional views (part 1) showing manufacturing steps of a monocrystalline silicon film by a conventional ELO method using a sacrificial layer having a different elemental composition.
Figure 2:
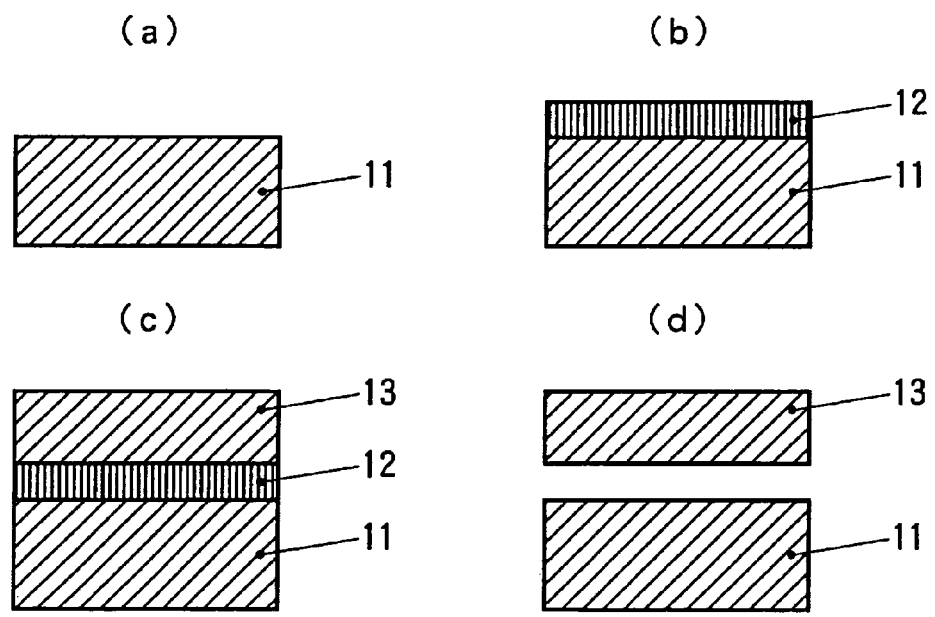
FIG. 2 includes cross-sectional views (part 2) showing manufacturing steps of a monocrystalline silicon film by a conventional ELO method using a sacrificial layer having a different elemental composition.
Figure 4:
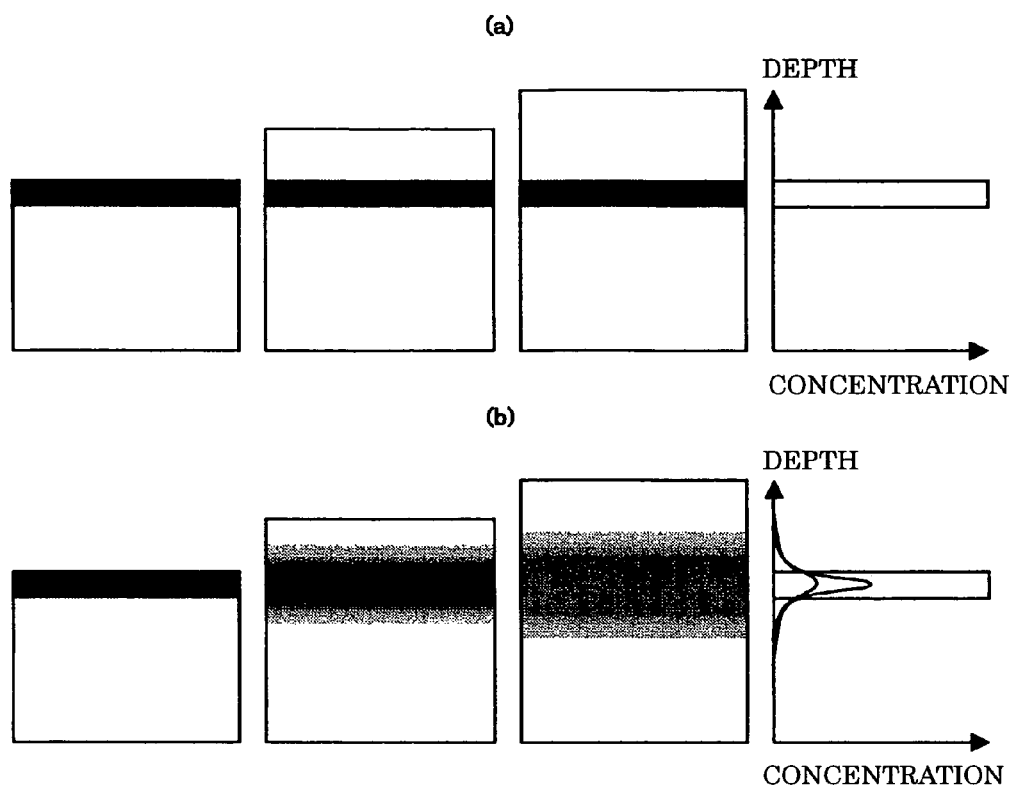
FIG. 4 includes schematic views for illustrating the diffusion of a dopant during epitaxial growth of a monocrystalline silicon thin film on the structure made of a highly doped silicon sacrificial layer and a monocrystalline silicon substrate, the diffusion being a conventional problem.
Figure 5:
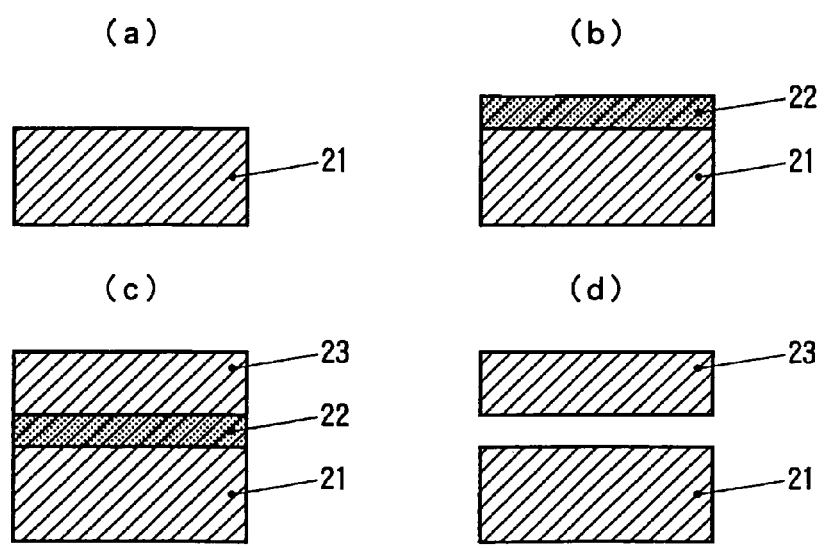
FIG. 5 includes cross-sectional views (part 1) showing manufacturing steps of a monocrystalline thin film of an example according to the present invention.

(1) FIG. 5 includes cross-sectional views (part 1) showing manufacturing steps of a monocrystalline thin film of an example according to the present invention.

First, as shown in FIG. 5(a), a monocrystalline substrate 21 is prepared. Next, as shown in FIG. 5(b), a monocrystalline sacrificial layer 22 containing crystal defects is epitaxially-grown using the same material as that of the monocrystalline substrate 21. Then, as shown in FIG. 5(c), a high-purity monocrystalline thin film 23 containing a small number of crystal defects is epitaxially-grown on this monocrystalline sacrificial layer 22 using the same material as that thereof. Subsequently, as shown in FIG. 5(d), the monocrystalline sacrificial layer 22 is etched (dissolved), and as a result, the high-purity monocrystalline thin film 23 containing a small number of crystal defects is obtained.

In addition, the remaining monocrystalline substrate 21 shown in FIG. 5(d) can be reused.

Figure 6:
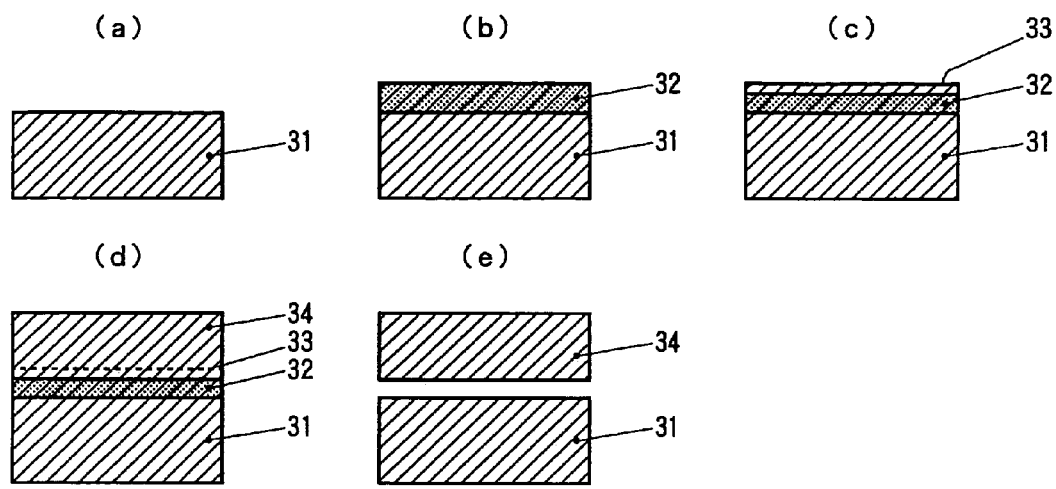
FIG. 6 includes cross-sectional views (part 2) showing manufacturing steps of a monocrystalline thin film of an example according to the present invention.

(2) FIG. 6 includes cross-sectional views (part 2) showing manufacturing steps of a monocrystalline thin film of an example according to the present invention.

First, as shown in FIG. 6(a), a monocrystalline substrate 31 is prepared. Next, as shown in FIG. 6(b), a monocrystalline sacrificial layer 32 containing crystal defects is epitaxially-grown using the same material as that of the monocrystalline substrate 31. Then, as shown in FIG. 6(c), crystal defects on a surface 33 of this monocrystalline sacrificial layer 32 are eliminated. Next, as shown in FIG. 6(d), on the surface 33 of the monocrystalline sacrificial layer 32, the crystal defects of which are eliminated, a high-purity monocrystalline thin film 34 containing a small number of crystal defects is epitaxially-grown using the same material as that of the monocrystalline sacrificial layer 32. Subsequently, as shown in FIG. 6(e), the monocrystalline sacrificial layer 32 is etched (dissolved), and as a result, the high-purity monocrystalline thin film 34 containing a small number of crystal defects is obtained.

Also in this case, the remaining monocrystalline substrate 31 shown in FIG. 6(e) can be reused.

Figure 7:
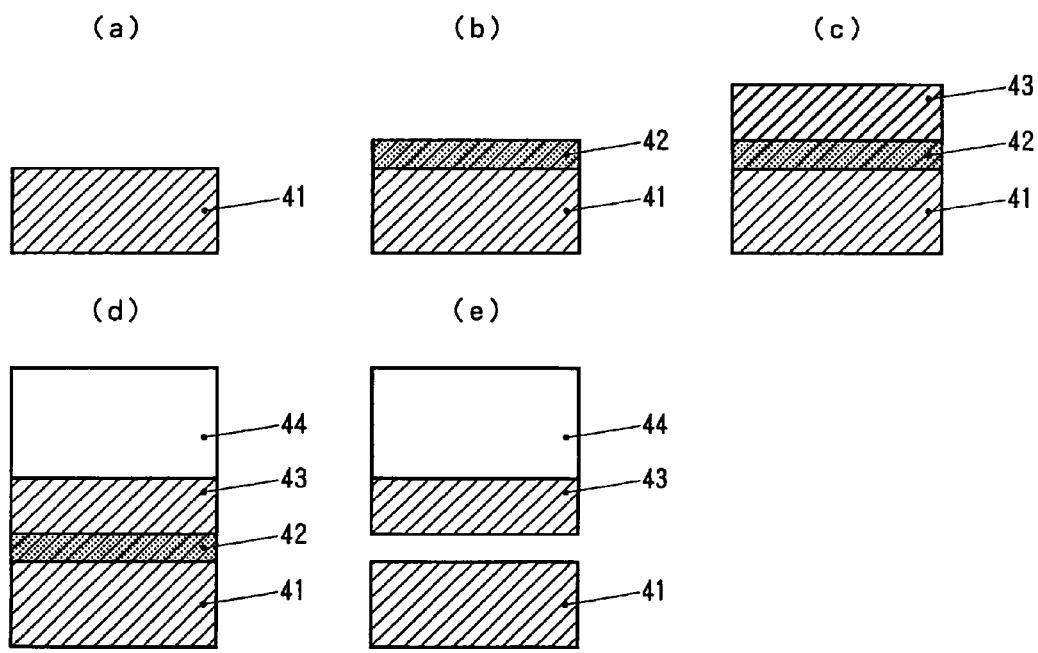
FIG. 7 includes cross-sectional views (part 3) showing manufacturing steps of a monocrystalline thin film of an example according to the present invention.

(3) FIG. 7 includes cross-sectional views (part 3) showing manufacturing steps of a monocrystalline thin film of an example according to the present invention.

First, as shown in FIG. 7(a), a monocrystalline substrate 41 is prepared. Next, as shown in FIG. 7(b), a monocrystalline sacrificial layer 42 containing crystal defects is epitaxially-grown using the same material as that of the monocrystalline substrate 41. Then, as shown in FIG. 7(c), a high-purity monocrystalline thin film 43 containing a small number of crystal defects is epitaxially-grown on this monocrystalline sacrificial layer 42 using the same material as that thereof.

Subsequently, as shown in FIG. 7(d), the high-purity monocrystalline thin film 43 containing a small number of crystal defects is supported by a support base material 44. Next, as shown in FIG. 7(e), the monocrystalline sacrificial layer 42 is etched (dissolved), and as a result, the high-purity monocrystalline thin film 43 is obtained which contains a small number of crystal defects and which is supported by the support base material 44.

Also in this case, the remaining monocrystalline substrate 41 shown in FIG. 7(e) can be reused.

Figure 8:
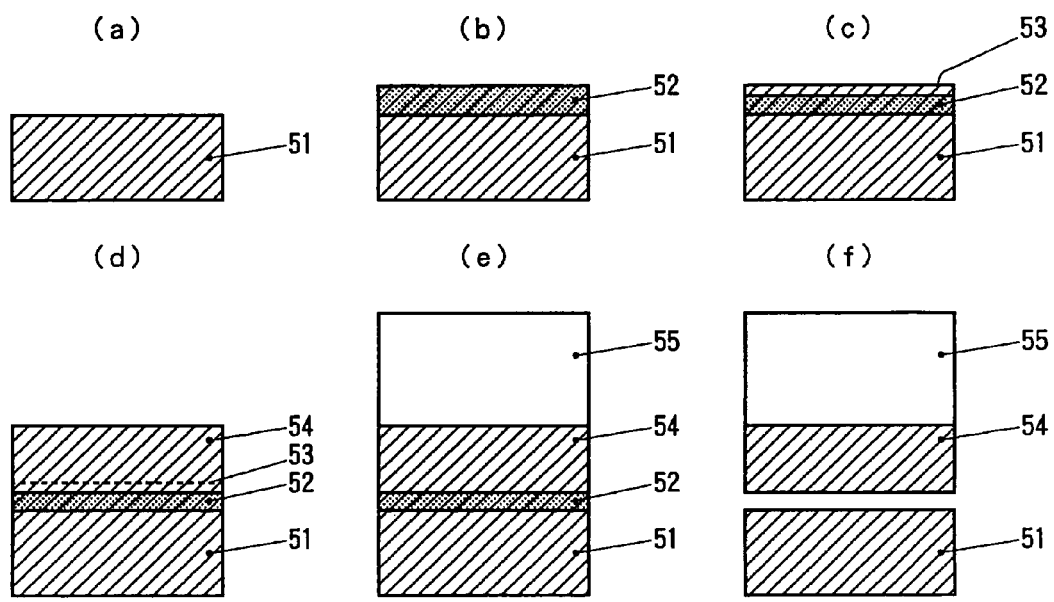
FIG. 8 includes cross-sectional views (part 4) showing manufacturing steps of a monocrystalline thin film of an example according to the present invention.

(4) FIG. 8 includes cross-sectional views (part 4) showing manufacturing steps of a monocrystalline thin film of an example according to the present invention.

First, as shown in FIG. 8(a), a monocrystalline substrate 51 is prepared. Next, as shown in FIG. 8(b), a monocrystalline sacrificial layer 52 containing crystal defects is epitaxially-grown using the same material as that of the monocrystalline substrate 51. Then, as shown in FIG. 8(c), crystal defects on a surface 53 of this monocrystalline sacrificial layer 52 are eliminated. Next, as shown in FIG. 8(d), on the surface 53 of the monocrystalline sacrificial layer 52, the crystal defects of which are eliminated, a high-purity monocrystalline thin film 54 containing a small number of crystal defects is epitaxially-grown using the same material as that of the monocrystalline sacrificial layer 52. Subsequently, as shown in FIG. 8(e), the high-purity monocrystalline thin film 54 is supported by a support base material 55. Next, as shown in FIG. 8(f), the monocrystalline sacrificial layer 52 is etched (dissolved), and as a result, the high-purity monocrystalline thin film 54 which contains a small number of crystal defects and which is supported by the support base material 55 is obtained.

Also in this case, the remaining monocrystalline substrate 51 shown in FIG. 8(f) can be reused.

(5) In the method for manufacturing a monocrystalline thin film according to one of the above (1) to (4), the monocrystalline substrate is a monocrystalline silicon substrate, the sacrificial layer is a silicon sacrificial layer, and the monocrystalline thin film is a monocrystalline silicon thin film.

(6) In the method for manufacturing a monocrystalline thin film, according to one of the above (1) to (4), the monocrystalline substrate is a monocrystalline GaAs substrate.

(7) In the method for manufacturing a monocrystalline thin film, according to one of the above (1) to (4), the monocrystalline substrate is an MgO substrate.

(8) In the method for manufacturing a monocrystalline thin film, according to one of the above (1) to (4), the step (b) is performed by a physical vapor deposition method or a chemical vapor deposition method at a temperature of 400 to 1,200° C., so that a silicon sacrificial layer containing crystal defects is formed by epitaxial growth.

(9) In the method for manufacturing a monocrystalline thin film, according to one of the above (1) to (4), the crystal defects include twins, vacancies, interstitial atoms, edge dislocations, and screw dislocations.

(10) In the method for manufacturing a monocrystalline thin film, according to the above (9), the number density of the crystal defects is $1/\mu m^2$ to $1/nm^2$ at the boundary between the monocrystalline silicon substrate and the silicon sacrificial layer.

Figure 9:
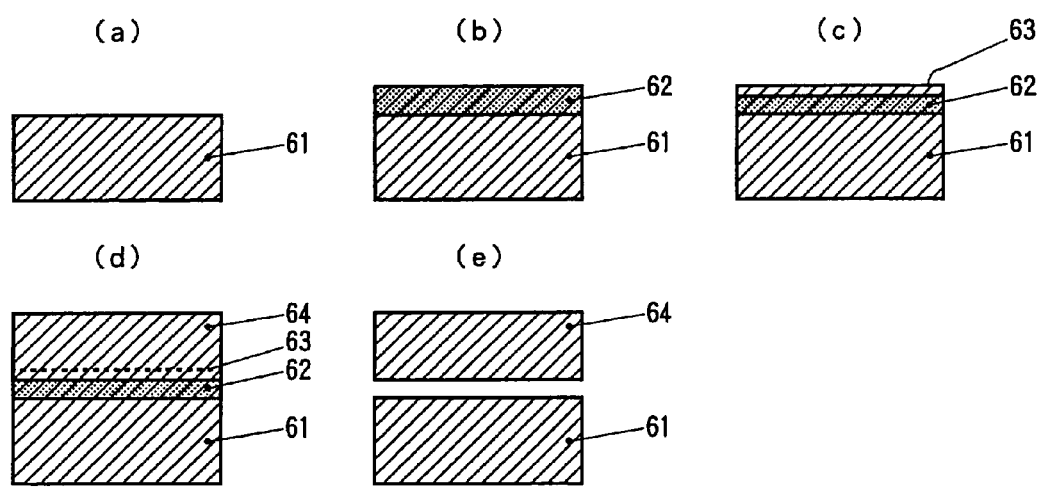
FIG. 9 includes cross-sectional views (part 5) showing manufacturing steps of a monocrystalline thin film of an example according to the present invention.

(11) FIG. 9 includes cross-sectional views (part 5) showing manufacturing steps of a monocrystalline thin film of an example according to the present invention. In this case, it is intended to obtain a monocrystalline silicon thin film as the monocrystalline thin film.

First, as shown in FIG. 9(a), a monocrystalline silicon substrate 61 is prepared. Next, as shown in FIG. 9(b), under a first film-forming condition in which a remaining gas pressure is relatively high and the temperature is relatively low, silicon is epitaxially-grown to form a monocrystalline silicon sacrificial layer 62 containing twins. Next, as shown in FIG. 9(c), by annealing in a reducing atmosphere, twins present on a surface 63 of the monocrystalline silicon sacrificial layer 62 are eliminated. Then, as shown in FIG. 9(d), under a second film-forming condition in which a remaining gas pressure is lower than that under the first film-forming condition and the temperature is high, a monocrystalline silicon thin film 64 containing a small number of defects is epitaxially-grown. Accordingly, as shown in FIG. 9(e), the monocrystalline silicon sacrificial layer 62 is etched (dissolved), and as a result, the high-purity monocrystalline silicon thin film 64 containing a small number of crystal defects is obtained.

In addition, after being epitaxially-grown, the high-purity monocrystalline silicon film 64 containing a small number of crystal defects which is supported by a support base material (not shown) may be manufactured by the steps of supporting the monocrystalline silicon film 64, which is located at an upper side, by the support base material and then etching (dissolving) the monocrystalline sacrificial layer 62.

Also in this case, the remaining monocrystalline substrate 61 shown in FIG. 9(e) can be reused.

(12) In the method for manufacturing a monocrystalline thin film, according to the above (2) or (4), following the step (b), thermal annealing is performed in a reducing atmosphere at a temperature of 1,000 to 1,400° C., so that crystal defects on the surface of the silicon sacrificial layer are eliminated.

(13) In the method for manufacturing a monocrystalline thin film, according to the above (12), after the above thermal annealing, the number density of twins present on the surface of the silicon sacrificial layer is one hundredth or less of that of twins present at the boundary between the monocrystalline silicon substrate and the silicon sacrificial layer.

(14) In the method for manufacturing a monocrystalline thin film, according to the above (3), the step (c) is performed by a physical vapor deposition method or a chemical vapor deposition method at a temperature of 1,000 to 1,400° C., so that a monocrystalline silicon thin film containing a small number of crystal defects is formed by epitaxial growth.

(15) In the method for manufacturing a monocrystalline thin film, according to the above (3), after the monocrystalline silicon thin film is supported by the support base material following the step (c), the silicon sacrificial layer is etched away so as to manufacture a monocrystalline silicon thin film.

(16) In the method for manufacturing a monocrystalline thin film, according to the above (3), holes are formed in the monocrystalline silicon substrate at intervals, so that etching of a silicon sacrificial layer is easily performed.

(17) In the method for manufacturing a monocrystalline thin film, according to the above (3), the thickness of the silicon sacrificial layer is set to 100 nm or less, so that roughness of the bottom surface of the monocrystalline silicon thin film is reduced to 100 nm or less.

(18) In the method for manufacturing a monocrystalline thin film, according to the above (3), the thickness of the silicon sacrificial layer is set to 100 nm or more, so that the bottom surface of the monocrystalline silicon thin film has a texture structure of 100 nm or more.

(19) In the method for manufacturing a monocrystalline thin film, according to one of the above (1) to (4), a texture structure is formed on the surface of the monocrystalline silicon substrate. Accordingly, in particular, it is intended to improve the energy conversion efficiency when the monocrystalline thin film is used as a photovoltaic layer of solar cells.

(20) In the method for manufacturing a monocrystalline thin film, according to one of the above (1) to (4), the etching (dissolution) of the silicon sacrificial layer is performed using a mixed solution of hydrofluoric acid and an oxidizing agent.

(21) A monocrystalline thin film device is obtained by the method for manufacturing a monocrystalline thin film, according to one of the above (1) to (20).

(22) In the monocrystalline thin film device according to the above (21), the monocrystalline thin film is a photovoltaic layer of solar cells.

(23) In the monocrystalline thin film device according to the above (21), the monocrystalline thin film is a monocrystalline thin film used for SOI.

(24) In a method for manufacturing a solar-cell monocrystalline silicon thin film, according to the above (23), the monocrystalline silicon thin film is epitaxially-grown at a temperature $T(° C.)$ and at a film growth rate $GR$ (μm/min) which satisfies the condition of $GR>2\times10^2\exp[-325(kJ/mol)/8.31(J/mol\cdot K)/(T+273)(K)]$, whereby the change in structure of the sacrificial layer is prevented.

(25) In the method for manufacturing a solar-cell monocrystalline thin film, according to the above (23) or (24), a rapid epitaxial growth of the monocrystalline silicon thin film is performed by a physical vapor deposition.

(26) In the method for manufacturing a solar-cell monocrystalline thin film, according to one of the above (23) to (25), the sacrificial layer is crystal silicon containing crystal defects.

(27) In the method for manufacturing a solar-cell monocrystalline thin film, according to the above (26), the crystal defects includes twins, vacancies, interstitial atoms, edge dislocations, and screw dislocations.

(28) In the method for manufacturing a solar-cell monocrystalline thin film, according to the above (26) or (27), the number density of the crystal defects is $1/\mu m^2$ to $1/nm^2$ at the boundary between the monocrystalline silicon substrate and the silicon sacrificial layer.

(29) In the method for manufacturing a solar-cell monocrystalline thin film, according to one of the above (25) to (28), crystal defects on the surface of the sacrificial layer are eliminated following the step (b).

(30) In the method for manufacturing a solar-cell monocrystalline thin film, according to one of the above (23) to (25), the sacrificial layer is highly doped monocrystalline silicon.

(31) In the method for manufacturing a solar-cell monocrystalline thin film, according to the above (30), a dopant doped in the highly doped monocrystalline silicon is an element of group III or V.

(32) In the method for manufacturing a solar-cell monocrystalline thin film, according to the above (30) or (31), the dopant concentration of the highly doped monocrystalline silicon is $10^{18}$ atoms/cm$^3$ or more.

(33) In the method for manufacturing a solar-cell monocrystalline thin film, according to one of the above (30) to (32), a dopant source is supplied onto the surface of the monocrystalline silicon substrate, so that the highly doped monocrystalline silicon sacrificial layer is formed.

(34) In the method for manufacturing a solar-cell monocrystalline thin film, according to one of the above (30) to (32), a silicon source and a dopant source are simultaneously supplied onto the monocrystalline silicon substrate, so that the highly doped monocrystalline silicon sacrificial layer is formed.

(35) In the method for manufacturing a solar-cell monocrystalline thin film, according to one of the above (30) to (32), a silicon source and a dopant source are supplied onto the monocrystalline silicon substrate while the ratio between the above two sources is controlled with time to form a highly doped layer and a lightly doped layer in a silicon film which is rapidly epitaxially-grown, and the former is used as the sacrificial layer and the latter is used as the monocrystalline silicon thin film for a photovoltaic layer of solar cells.

(36) In the method for manufacturing a solar-cell monocrystalline thin film, according to one of the above (23) to (25), the sacrificial layer comprises compound crystal containing silicon.

(37) In the method for manufacturing a solar-cell monocrystalline thin film, according to the above (36), the compound crystal containing silicon is a metal silicide including $CoSi_2$, $NiSi_2$, or $CrSi_2$.

(38) In the method for manufacturing a solar-cell monocrystalline thin film, according to one of the above (23) to (25), the sacrificial layer comprises crystal containing no silicon.

(39) In the method for manufacturing a solar-cell monocrystalline thin film, according to one of the above (23) to (38), the sacrificial layer is etched using an aqueous solution containing hydrofluoric acid, so that the monocrystalline silicon thin film used as a photovoltaic layer of solar cells is manufactured.

(40) In the method for manufacturing a solar-cell monocrystalline thin film, according to one of the above (23) to (39), after the monocrystalline silicon thin film is supported by a support base material following the step (c), the silicon sacrificial layer is etched away so as to manufacture the monocrystalline silicon thin film used as a photovoltaic layer of solar cells.

(41) In the method for manufacturing a solar-cell monocrystalline thin film, according to one of the above (23) to (40), holes are formed in the monocrystalline silicon substrate at intervals.

(42) In the method for manufacturing a solar-cell monocrystalline thin film, according to one of the above (23) to (41), a texture structure is formed on the surface of the monocrystalline silicon substrate.

(43) A monocrystalline silicon thin film solar cell is obtained by the method for manufacturing a solar-cell monocrystalline silicon thin film according to one of the above (23) to (42).

Hereinafter, particular examples will be described.

Example 1

Figure 10:
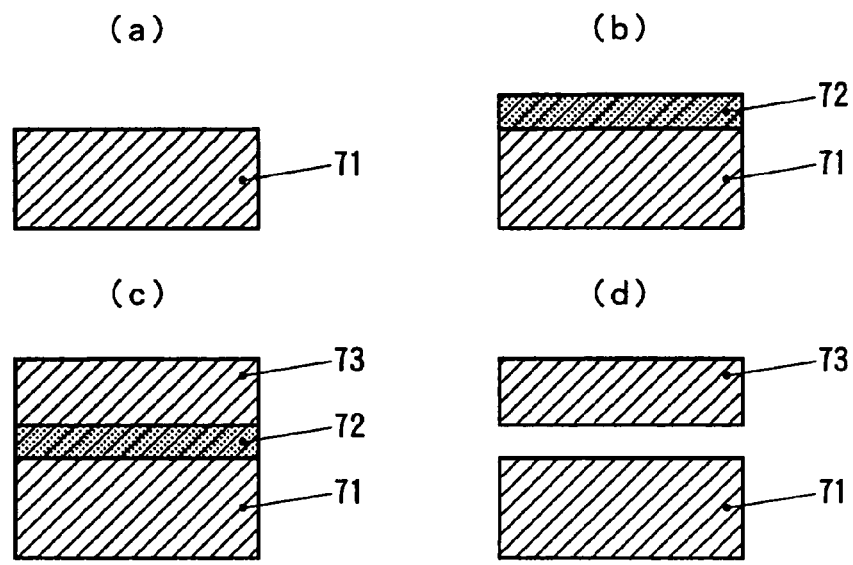
FIG. 10 includes cross-sectional views showing manufacturing steps of Example 1 according to the present invention.

FIG. 10 includes cross-sectional views showing manufacturing steps of Example 1 according to the present invention.

(1) First, as shown in FIG. 10(a), a monocrystalline silicon substrate (such as 500 μm thick) 71 is prepared.

This monocrystalline silicon substrate 71 has a flat upper surface since a monocrystalline silicon sacrificial film, which will be described later, is to be epitaxially-grown.

(2) Next, as shown in FIG. 10(b), on the monocrystalline silicon substrate 71, by a sputter-deposition method with substrate heating, silicon containing crystal defects is epitaxially-grown in an atmosphere containing small amounts of oxygen and water vapor. That is, a monocrystalline silicon sacrificial film (such as 0.1 to 1 μm thick) 72 containing crystal defects is formed. This monocrystalline silicon sacrificial film 72 can be easily and precisely removed by etching, as described later.

(3) Next, as shown in FIG. 10(c), on the monocrystalline silicon sacrificial film 72, monocrystalline silicon containing a small number of defects is epitaxially-grown by a CVD method. That is, a high-purity monocrystalline silicon thin film (such as 10 μm thick) 73 containing a small number of crystal defects is formed. Accordingly, a three-layered structure which is formed of the same material and which includes the monocrystalline silicon sacrificial film 72 containing crystal defects as the intermediate layer.

As the epitaxial growth, various methods may be used; for example, as vapor phase growth, a CVD method using a silane gas or a chlorosilane gas or an evaporation method using silicon may be mentioned.

(4) Next, as shown in FIG. 10(d), selective etching of the monocrystalline silicon sacrificial film 72 is performed using a $HF/HNO_3/CH_3COOH$ mixed solution or a $HF/KMnO_4/CH_3COOH$ mixed solution, so that the high-purity monocrystalline silicon thin film 73 containing a small number of defects is separated.

Figure 11:
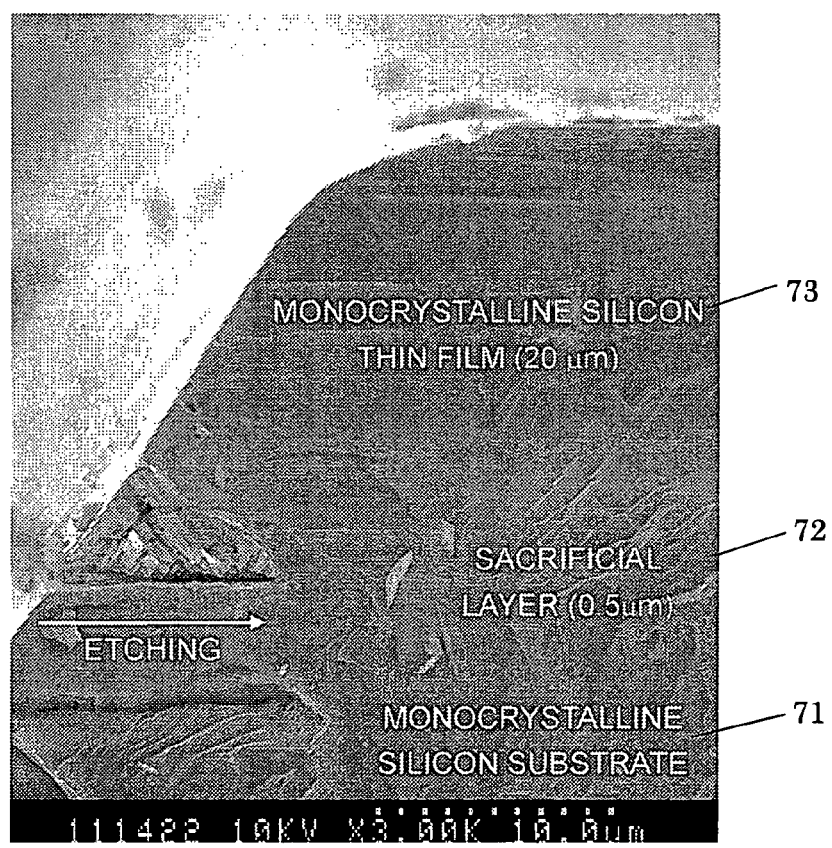
FIG. 11 is an electron microscope photograph showing a cross-section of a sample which is obtained when a part of a sacrificial layer of Example 1 according to the present invention is etched.

FIG. 11 is an electron microscope photograph showing a cross-section of a sample which is obtained as described below. The sample is obtained by the steps of forming the silicon sacrificial film 72 containing crystal defects and having a thickness of 0.5 μm on the monocrystalline silicon substrate 71 by epitaxial growth using a sputter-deposition method with substrate heating at a temperature of 600° C., then forming the monocrystalline silicon thin film 73 containing a small number of defects and having a thickness of 20 μm on the above sacrificial film by a chemical vapor deposition method at a temperature of 1,200° C. using a mixture of trichlorosilane and a hydrogen gas as raw materials, and then etching a part of the sacrificial film 72 using a $HF/HNO_3/CH_3COOH$ mixed solution. In the figure, the state is shown in which the sacrificial film 72 is selectively etched.

Example 2

Figure 12:
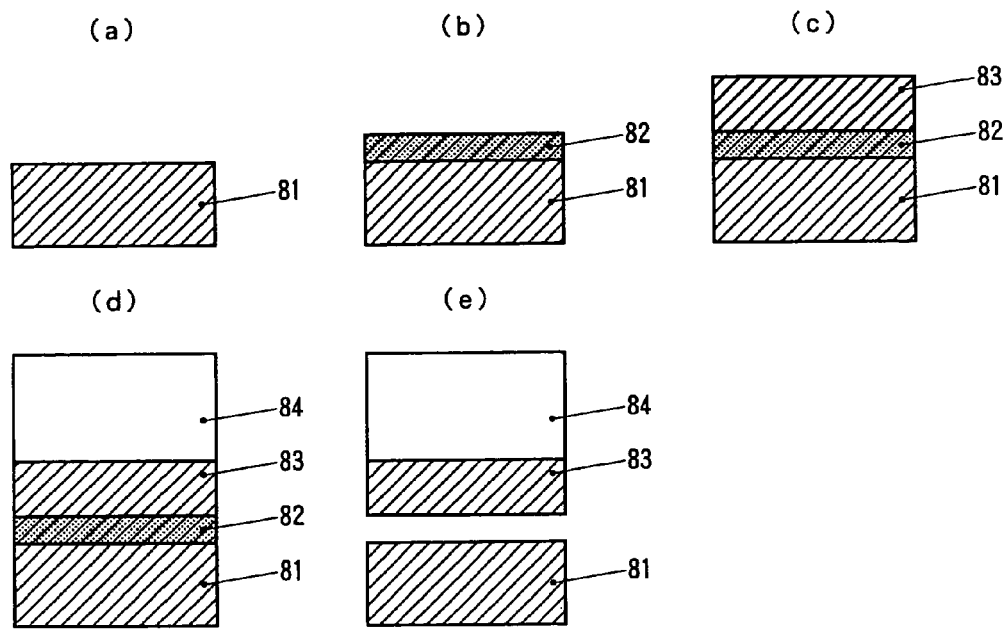
FIG. 12 includes cross-sectional views showing manufacturing steps of Example 2 according to the present invention.

FIG. 12 includes cross-sectional views showing manufacturing steps of Example 2 according to the present invention.

(1) First, as shown in FIG. 12(a), a monocrystalline silicon substrate (such as 500 μm thick) 81 is prepared.

This monocrystalline silicon substrate 81 has a flat upper surface since a monocrystalline silicon sacrificial film, which will be described later, is to be epitaxially-grown.

(2) Next, as shown in FIG. 12(b), on the monocrystalline silicon substrate 81, by a sputter-deposition method with substrate heating, silicon containing crystal defects is epitaxially-grown in an atmosphere containing small amounts of oxygen and water vapor. That is, a monocrystalline silicon sacrificial film (such as 0.1 to 1 μm thick) 82 is formed. This monocrystalline silicon sacrificial film 82 can be easily and precisely removed by etching, as described later.

(3) Next, as shown in FIG. 12(c), on the monocrystalline silicon sacrificial film 82, monocrystalline silicon containing a small number of defects is epitaxially-grown by a CVD method. That is, a high-purity monocrystalline silicon thin film (such as 10 μm thick) 83 containing a small number of crystal defects is formed. Accordingly, a three-layered structure which is formed of the same material and which includes the monocrystalline silicon sacrificial film 82 containing crystal defects as the intermediate layer.

As the epitaxial growth, various methods may be used; however, for example, as vapor phase growth, a CVD method using a silane gas or a chlorosilane gas or an evaporation method using silicon may be mentioned.

(4) Next, as shown in FIG. 12(d), a support base material 84 is held on the monocrystalline silicon thin film 83. As the support base material 84, a reinforced glass may be used.

(5) Next, as shown in FIG. 12(e), selective etching of the monocrystalline silicon sacrificial film 82 is performed using a $HF/HNO_3/CH_3COOH$ mixed solution or a $HF/KMnO_4/CH_3COOH$ mixed solution, so that the high-purity monocrystalline silicon thin film 83 is separated which contains a small number of defects and which is supported by the support base material 84.

Example 3

Figure 13:
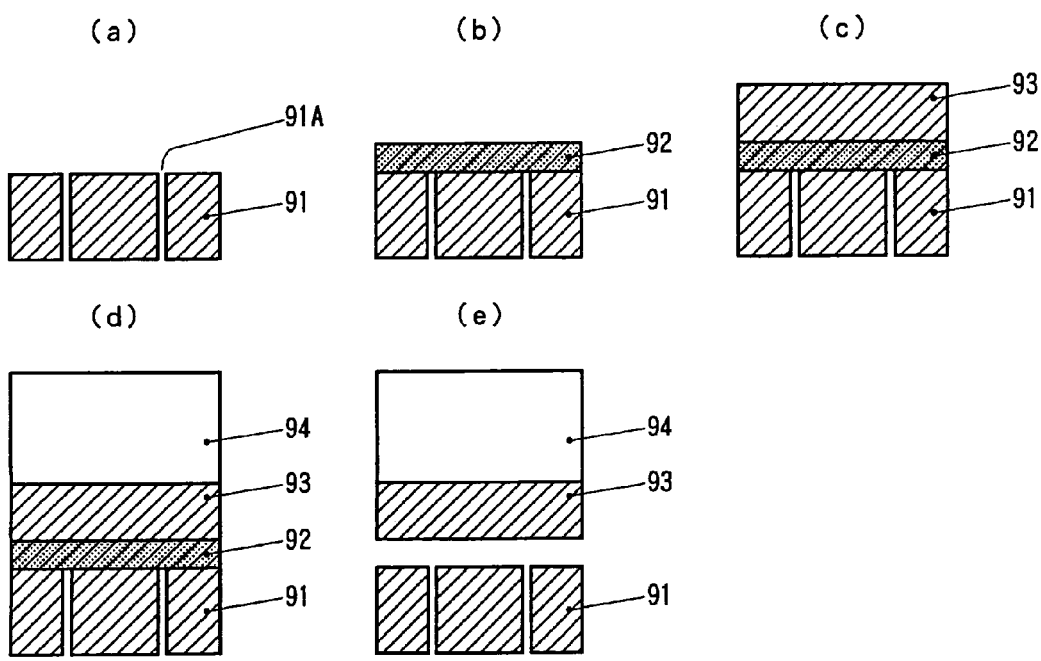
FIG. 13 includes cross-sectional views showing manufacturing steps of a monocrystalline thin film of Example 3 according to the present invention.

FIG. 13 includes cross-sectional views showing manufacturing steps of a monocrystalline thin film of Example 3 according to the present invention.

This example is the same as Examples 1 and 2 except that holes 91A are formed in a monocrystalline silicon substrate 91 at intervals. That is, (1) first, as shown in FIG. 13(a), the monocrystalline silicon substrate 91 is prepared in which the holes 91A are provided at intervals.

Figure 14:
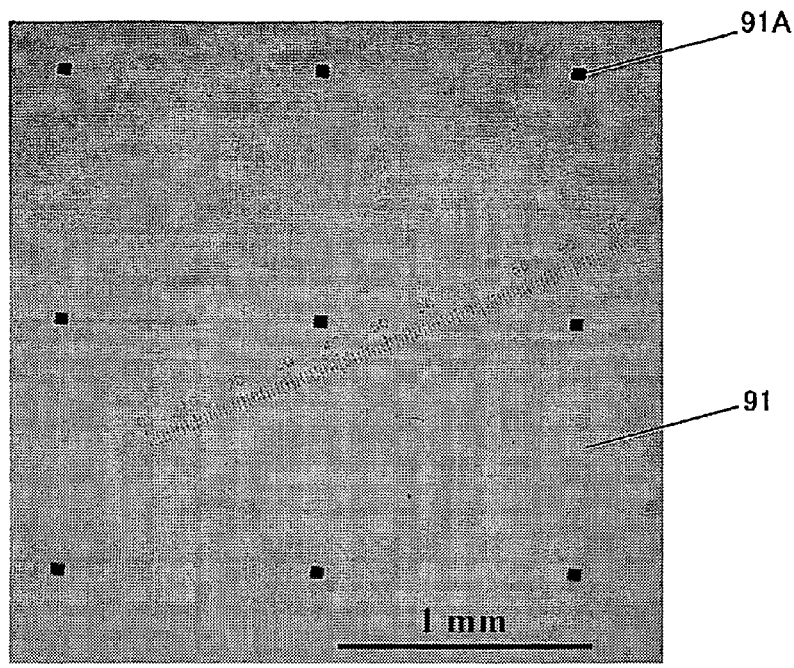
FIG. 14 is an optical microscope photograph showing a plane surface of a substrate provided with holes of Example 3 according to the present invention.

An optical microscope photograph of a plane surface of the monocrystalline silicon substrate 91 is shown FIG. 14 in which the holes 91A of 100 μm in diameter are formed at 1 mm intervals by photolithography and selective etching.

(2) Next, as shown in FIG. 13(b), on the monocrystalline silicon substrate 91, by a sputter-deposition method with substrate heating, silicon containing defects is epitaxially-grown in an atmosphere containing small amounts of oxygen and water vapor. That is, a monocrystalline silicon sacrificial film 92 is formed.

(3) Next, as shown in FIG. 13(c), on the monocrystalline silicon sacrificial film 92, monocrystalline silicon containing a small number of defects is epitaxially-grown by a CVD method. That is, a monocrystalline silicon thin film 93 containing a small number of crystal defects is formed.

As the epitaxial growth, various methods may be used; however, for example, as vapor phase growth, a CVD method using a silane gas or a chlorosilane gas or an evaporation method using silicon may be mentioned.

(4) Next, as shown in FIG. 13(d), a support base material 94 is held on the monocrystalline silicon thin film 93. As the support base material 94, a reinforced glass may be used.

(5) Next, as shown in FIG. 13(e), selective etching of the monocrystalline silicon sacrificial film 92 is performed using a HF/HNO$_3$/CH$_3$COOH mixed solution or a HF/KMnO$_4$/CH$_3$COOH mixed solution. In this case, since the etchant is likely to enter the holes 91A formed in the monocrystalline silicon substrate 91 at intervals, separation of the monocrystalline silicon thin film 93 having a small number of defects can be smoothly performed. That is, the monocrystalline silicon sacrificial film 92 can be rapidly and precisely removed.

In this example, the formation of holes is applied to the manufacturing method of Example 2 and may also be applied to that of Example 1.

In addition, by decreasing the thickness of the silicon sacrificial layer 92 to 100 nm or less, the roughness of the bottom surface of the monocrystalline silicon thin film 93 can be reduced to 100 nm or less.

In addition, by increasing the thickness of the silicon sacrificial layer 92 to 100 nm or more, a texture structure of 100 nm or more may be formed on the bottom surface of the monocrystalline silicon thin film 93. In particular, when the monocrystalline silicon thin film is used as a photovoltaic layer of solar cells, sunlight can be efficiently brought into the monocrystalline thin film, and hence the energy conversion efficiency can be improved.

Example 4

Figure 15:
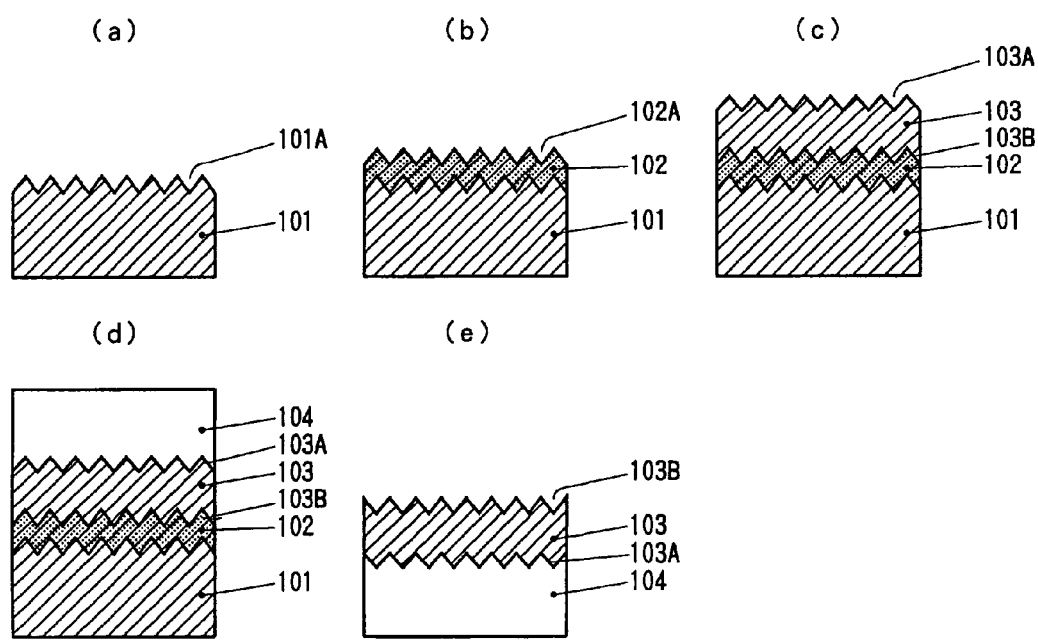
FIG. 15 includes cross-sectional views showing manufacturing steps of a monocrystalline thin film of Example 4 according to the present invention.
Figure 16:
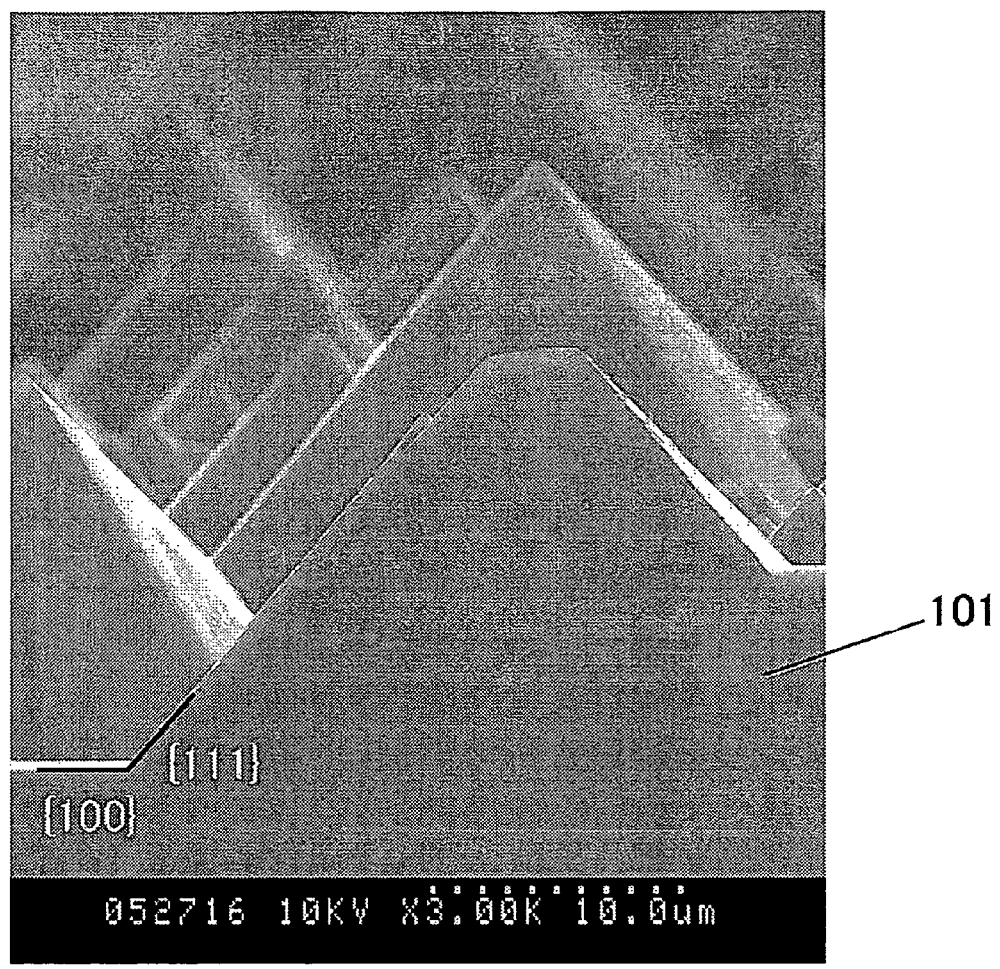
FIG. 16 is an electron microscope photograph showing a cross-section of a substrate having a pyramid-shaped texture of Example 4 according to the present invention.

FIG. 15 includes cross-sectional views showing manufacturing steps of a monocrystalline thin film of Example 4 according to the present invention. FIG. 16 is an electron microscope photograph showing a cross-section of a substrate having a pyramid-shaped texture of Example 4 according to the present invention.

This example is the same as Examples 1 and 2 except that a texture structure 101A is formed on the surface of a monocrystalline silicon substrate 101. That is, (1) first, as shown in FIG. 15(a), the monocrystalline silicon substrate 101 having the texture structure 101A formed on the surface thereof is prepared.

The rate of dissolution of the {111} plane of silicon by an alkali solution is slowest. An electron microscope photograph of a cross-section of the substrate 101 is shown in FIG. 16 which is formed of a Si(100) wafer and a pyramid-shaped texture of the {111} planes provided thereon by using the properties described above.

(2) Next, as shown in FIG. 15(b), on the monocrystalline silicon substrate 101 thus prepared, by a sputter-deposition method with substrate heating, silicon containing defects is epitaxially-grown in an atmosphere containing small amounts of oxygen and water vapor. That is, a monocrystalline silicon sacrificial film 102 having the texture structure on the surface thereof is formed.

(3) Next, as shown in FIG. 15(c), on the monocrystalline silicon sacrificial film 102, monocrystalline silicon containing a small number of defects is epitaxially-grown by a CVD method. That is, a monocrystalline silicon thin film 103 containing a small number of crystal defects is formed which has a texture structure 103B on the front surface and a texture structure 103A on the rear surface.

(4) Next, as shown in FIG. 15(d), a support base material 104 is held on the monocrystalline silicon thin film 103.

(5) Next, as shown in FIG. 15(e), selective etching of the monocrystalline silicon sacrificial film 102 is performed using a HF/HNO$_3$/CH$_3$COOH mixed solution or a HF/KMnO$_4$/CH$_3$COOH mixed solution, so that the monocrystalline silicon thin film 103 is separated which is supported by the support base material 104 and which has the texture structure 103A on the front surface and the texture structure 103B on the rear surface.

In this example, the formation of a texture structure is applied to the manufacturing method of Example 2 and may also be applied to that of Example 1.

Next, by using the above methods for manufacturing a monocrystalline silicon thin film, the invention of forming a photovoltaic layer of solar cells will be described.

As a method for forming silicon on a monocrystalline silicon substrate by epitaxial growth, a physical vapor deposition (PVD) may be mentioned by way of example. In general, this method is known as a method used in a laboratory in which silicon is slowly grown at a low temperature under ideal conditions (ultra-high vacuum conditions or the like). On the other hand, as a production process, a chemical vapor deposition (CVD) method is known as a method in which a semiconductor layer is rapidly deposited at a high temperature.

Figure 17:
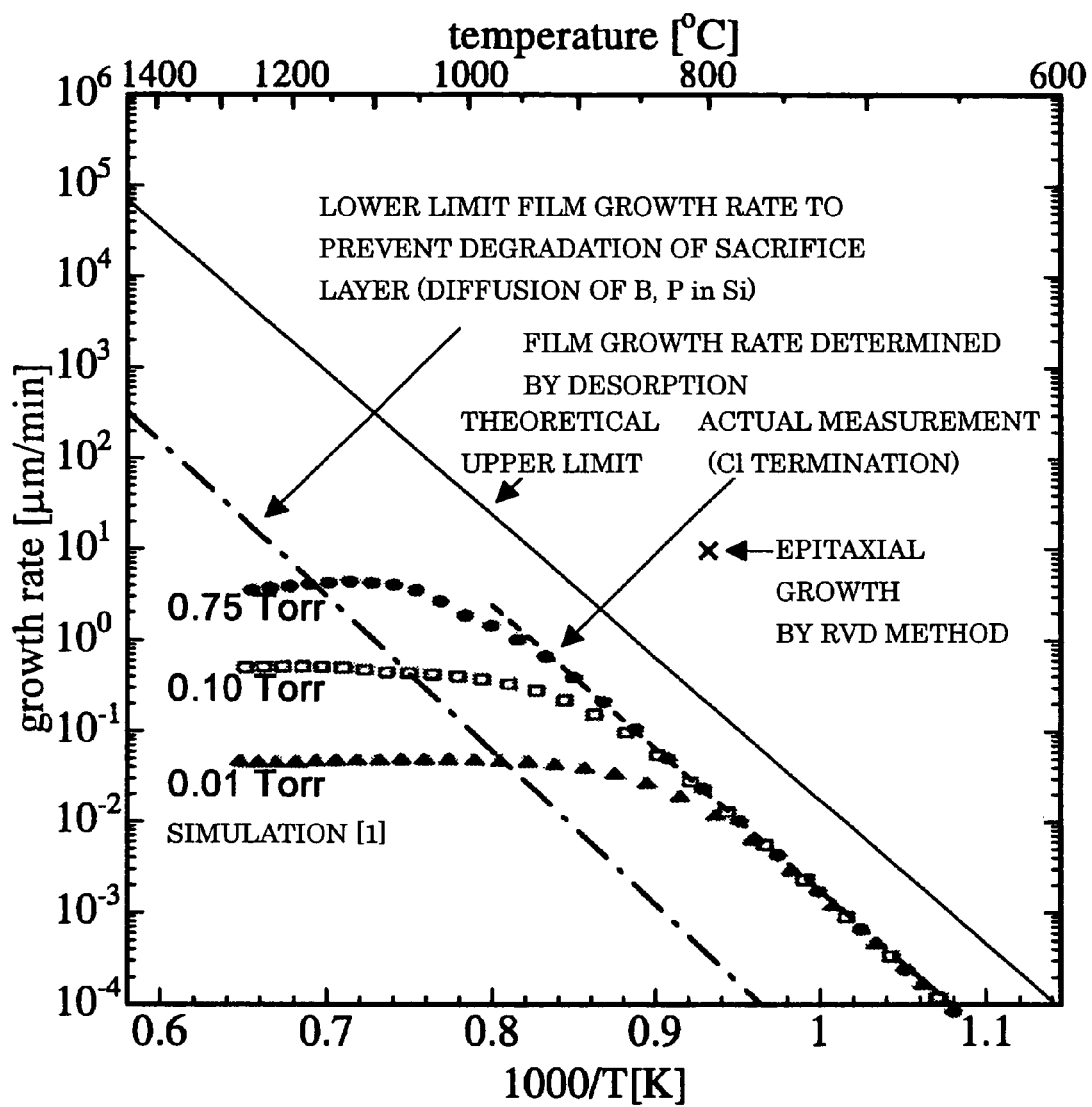
FIG. 17 is a view showing the relationship between the temperature and the film growth rate according to the present invention.

In the case in which a monocrystalline silicon thin film is epitaxially-grown by a CVD method, when a chlorosilane is used as a raw material by way of example, as shown in FIG. 17, the film growth rate is determined by the desorption of chemical species such as SiCl$_2$ or HCl and reaches an upper limit rate of 1 to 10 μm/min at approximately 1,200° C. When the temperature is increased, the rate can be increased; however, the reaction rate is liable to be determined by the supply of a raw material, and a rate of several micrometers per minute becomes an actual upper limit. This rate is approximately equivalent to a lower limit of a film growth rate GR for preventing degradation of the sacrificial layer, which will be described later, and hence it is understood that degradation of the sacrificial layer cannot be easily suppressed by a CVD method. In addition, in the ELO method using a doped silicon layer, which was proposed by the inventor of the present invention, when a monocrystalline silicon thin film is formed on a doped silicon sacrificial layer by a CVD method, it will take 1 to 10 minutes by the afore-mentioned growth rate to form a monocrystalline silicon thin film having a thickness of 10 μm, and during this period, a dopant diffuses into the monocrystalline silicon thin film; hence, a problem occurs in that the sacrificial layer cannot be maintained.

On the other hand, in a PVD method, since only silicon adsorbs, the desorption of chemical species does not occur. Hence, the film growth rate can be optionally increased more than the upper limit rate determined by the desorption of chemical species. However, when the film growth rate is excessively increased, silicon will not be epitaxially-grown at a low temperature and may form a polycrystalline or an amorphous form. However, for example, by melt growth performed at 1,410° C. which is a melting point of silicon, it has been known that epitaxial growth at a rate of 10 mm/sec, that is, 600,000 μm/min can be performed. Accordingly, when the temperature is increased close to the melting point, epitaxial growth can be performed even by rapid vapor deposition (RVD).

Features of a RVD method will be described in detail with reference to a highly doped sacrificial layer formed by using B or P. Since a targeted thickness of a monocrystalline silicon thin film is 10 μm, the thickness of the sacrificial layer is preferably one tenth thereof or less, that is, 1 μm or less. When a dopant (B, P) diffuses 1 μm, the structure of the sacrificial layer is degraded, and when the diffusion coefficient is represented by D, the time constant in this case is $(1\ \mu m)^2/D$. Since the monocrystalline silicon thin film located at the upper side must be grown to have a thickness of 10 μm or more within this period, the film growth rate GR must be more than 10D/1 μm. By using a known relationship between a diffusion coefficient D and a temperature T, the following equation, $GR > 2 \times 10^{12} \exp(-325 [kJ/mol]/8.31[J/mol \cdot K]/(T+273)[K])$, is obtained. FIG. 17 is a graph showing the relationship between the temperature and the film growth rate thus obtained. The source of FIG. 17 is: P. A. Coon, M. L. Wise, S. M. George. J. Cryst. Growth 130, 162 (1993).

When PVD was actually performed at a substrate temperature of 800° C. and at a silicon-melt temperature of 1,800° C., a monocrystalline silicon thin film could be successfully epitaxially-grown at a rate of 10 μm/min. As apparent from FIG. 17, the rate can be increased by 20,000 times or more that of a targeted film growth rate, and hence the structural degradation of the sacrificial layer can be easily suppressed.

Figure 18:
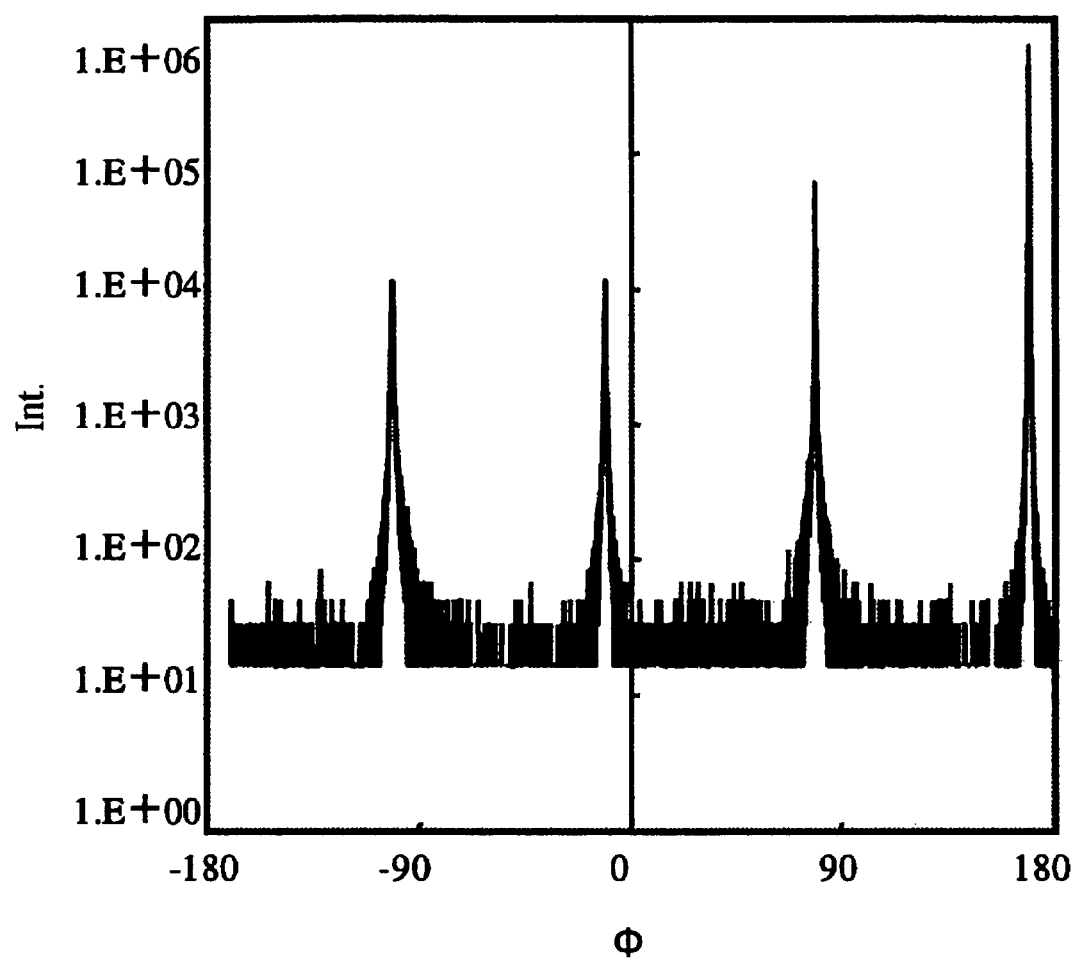
FIG. 18 is a graph showing a φ scanning measurement result of in-plane x-ray diffraction (XRD) of the (220) plane of a silicon thin film according to the present invention.

FIG. 18 is a graph showing a φ scanning measurement result (in-plane x-ray diffraction (XRD) pattern) of in-plane x-ray diffraction of the (220) plane of the silicon thin film thus obtained. As shown in this graph, 4-fold symmetry peaks of the (220) plane were observed, and hence it was shown that a monocrystalline silicon thin film is epitaxially-grown in the same (100) orientation as that of the substrate.

Figure 19:
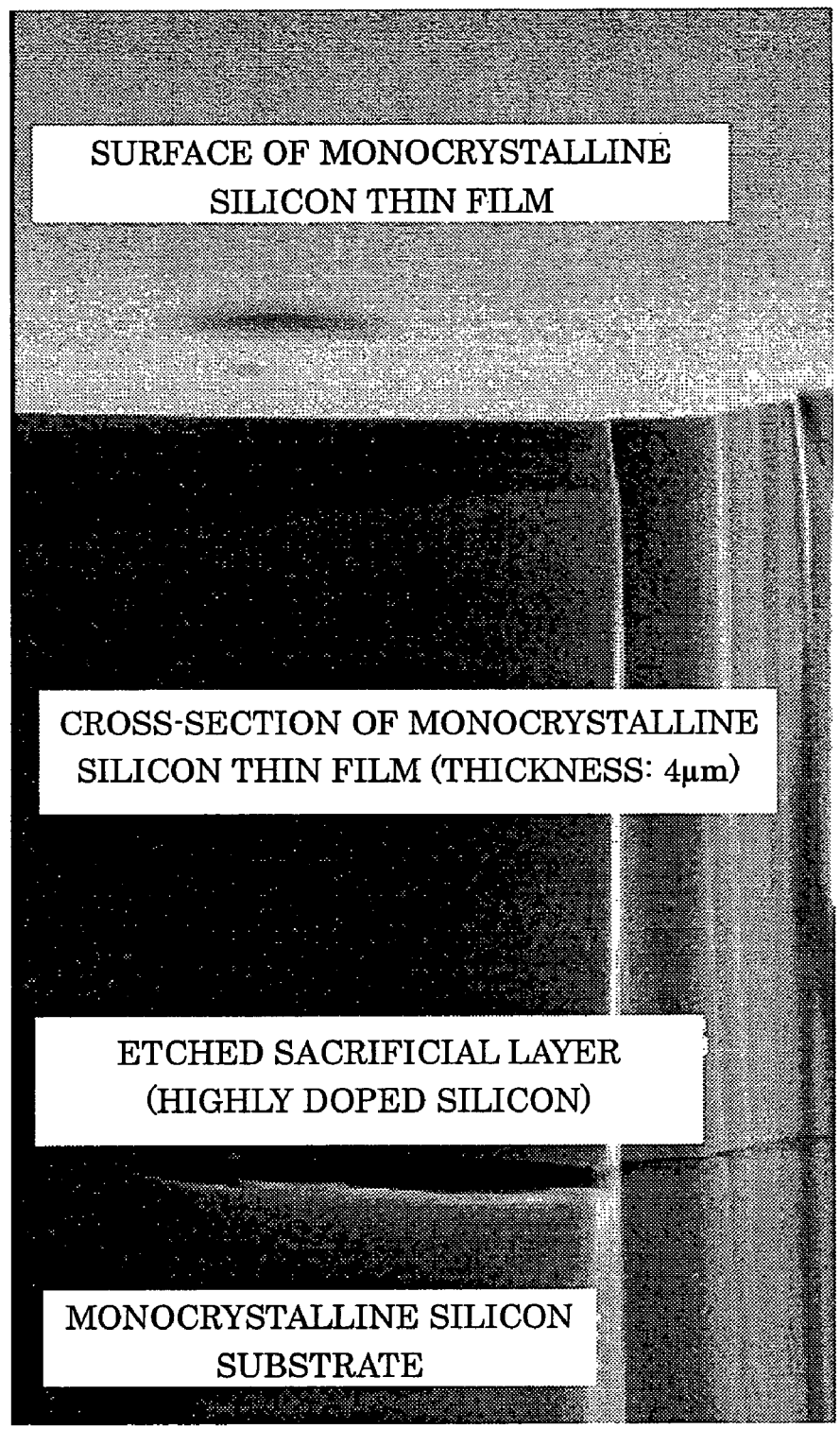
FIG. 19 is a scanning electron microscope photograph showing a cross-sectional view of a selectively etched structure formed of a monocrystalline silicon thin film, a highly p-doped silicon sacrificial layer, and a monocrystalline silicon substrate according to the present invention.

In addition, when selective etching of a three-layered structure was actually performed which contains highly p-doped silicon as the sacrificial layer, as shown by an electron microscope photograph of FIG. 19 indicating a cross-section, selective etching was preferably performed.

In particular, on a monocrystalline silicon substrate, a highly p-doped silicon sacrificial layer was formed by a diffusion method, a monocrystalline silicon thin film having a thickness of 4 μm was formed thereon by a RVD method, and then etching was performed for one minute with a mixed solution containing hydrofluoric acid, nitric acid, and acetic acid. FIG. 19 is a scanning electron microscope photograph showing a cross-section of a laminate made of the monocrystalline silicon thin film, the highly p-doped silicon sacrificial layer, and the monocrystalline silicon substrate, which was processed by selective etching. As shown in this figure, only the sacrificial layer was selectively etched. As described above, when a RVD method is used, the monocrystalline silicon thin film can be formed without degrading the structure of the sacrificial layer, and the monocrystalline silicon thin film and the monocrystalline silicon substrate can be easily separated from each other by selective etching of the sacrificial layer.

Accordingly, when the above RVD method is combined with the ELO method described above, the lift-off of a monocrystalline silicon thin film can be preferably performed, and a monocrystalline silicon thin film and a monocrystalline silicon thin film solar cell formed therefrom can also be obtained.

That is, while the diffusion of the dopant, which is contained in the doped silicon sacrificial layer used in the ELO method, is suppressed, the lift-off of the monocrystalline silicon film can be preferably performed.

In addition, since a RVD method is also effective in order to suppress the defect elimination of the sacrificial layer having crystal defects, by using the RVD method, the defect elimination of the sacrificial layer having crystal defects can be suppressed, and hence the lift-off of the monocrystalline silicon film can be preferably performed.

In addition, by forming the structure as described above, when a monocrystalline silicon thin film containing a particularly small number of defects is used as a photovoltaic layer of solar cells, the power efficiency can be improved.

By the method described above, a monocrystalline silicon thin film containing a small number of defects or a monocrystalline silicon thin film which contains a small number of defects and which is supported by a support base material can be obtained and can then be used for a monocrystalline thin film device. For example, the above monocrystalline silicon thin film can be used as a photovoltaic layer of solar cells or can be used for an SOI semiconductor device.

Finally, from a broad point of view, significant merits in terms of silicon supply can also be obtained. When a monocrystalline silicon thin film is grown from a high-purity silicon source, in a CVD method, silicon and hydrogen chloride must first be allowed to react with each other to form a chlorosilane. However, since chlorine corrodes apparatuses, the purity of the chlorosilane can easily be disadvantageously degraded, and as a result, purification steps may occupy most of the entire process. Basically, the formation of chlorosilane is a method for vaporizing and purifying low-purity metallurgical grade silicon; hence, there is no merit to form a chlorosilane from high-purity silicon. On the other hand, when high-purity silicon is melted by heating, and a PVD method is used, problems such as corrosion of apparatuses and contamination of impurities will not occur, and as a result, the process itself can be very simplified. Furthermore, since the process time can be decreased by rapid film formation, a significant advantage can be obtained.

Hereinafter, a method for manufacturing a solar-cell monocrystalline silicon thin film according to the present invention will be described with reference to examples.

Figure 20:
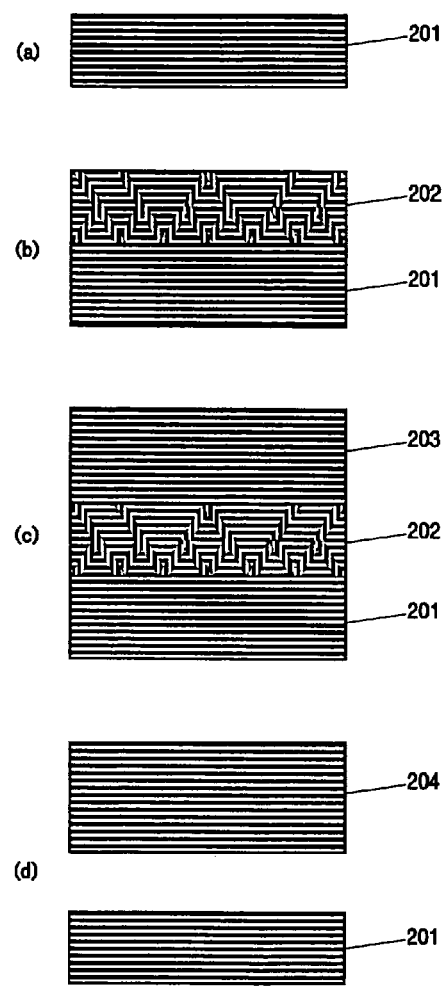
FIG. 20 includes schematic cross-sectional views showing manufacturing steps of a solar-cell monocrystalline silicon thin film of an example according to the present invention.

FIG. 20 includes schematic cross-sectional views showing manufacturing steps of a solar-cell monocrystalline silicon thin film of an example according to the present invention.

As shown in FIG. 20(a), a monocrystalline silicon substrate (template Si substrate) 201 is prepared, and as shown in FIG. 20(b), on this monocrystalline silicon substrate 201, an epitaxial sacrificial layer 202 is formed. Next, as shown in FIG. 20(c), on this sacrificial layer 202, a monocrystalline silicon thin film 203 is rapidly epitaxially-grown by a RVD method. Subsequently, as shown in FIG. 20(d), the sacrificial layer 202 is etched, so that a monocrystalline silicon thin film 204 used as a photovoltaic layer of solar cells is obtained.

In the case described above, the monocrystalline silicon thin film 204 used as a photovoltaic layer of solar cells is epitaxially-grown at a temperature T (° C.) and a at a film growth rate GR (μm/min) to satisfy $GR > 2 \times 10^{12} \exp[-325(kJ/mol)/8.31(J/mol \cdot K)/(T+273)(K)]$, so that the change in structure of the sacrificial layer 202 can be prevented.

In addition, in the case described above, a rapid epitaxial growth of the monocrystalline silicon thin film 204 used as a photovoltaic layer of solar cells is performed by a PVD method.

As described above, in the PVD method, since only silicon adsorbs, no desorption of chemical species occurs. Hence, the film growth rate can be optionally increased more than the upper limit rate which is determined by the desorption. In this case, when the substrate temperature is sufficiently increased, epitaxial growth can be performed by a RVD method.

Accordingly, when silicon is deposited by a RVD method after the sacrificial layer 202 shown in FIG. 20(b) is formed, the monocrystalline silicon thin film 203 can be rapidly epitaxially-grown on the surface of the sacrificial layer 202.

Furthermore, as the sacrificial layer, crystalline silicon containing crystal defects may be used.

In the case described above, the crystal defects may include twins, vacancies, interstitial atoms, edge dislocations, and screw dislocations.

In addition, the number density of the crystal defects may be $1/\mu m^2$ to $1/nm^2$ at the boundary between the monocrystalline silicon substrate and the silicon sacrificial layer.

Furthermore, after the sacrificial layer is formed, crystal defects on the surface of the sacrificial layer may be eliminated. That is, in the ELO method, as the sacrificial layer, a monocrystalline layer containing crystal defects is used which is formed from the same elemental composition. For example, in manufacturing of a monocrystalline silicon thin film, when silicon is grown on a monocrystalline silicon substrate in an atmosphere containing small amounts of oxygen and water vapor, a silicon layer is being epitaxially-grown as a whole; however, crystal defects such as twins may be included in the silicon layer. Subsequently, when thermal annealing is performed in a reducing atmosphere (hydrogen atmosphere), because of surface diffusion of silicon, defects on the topmost surface are eliminated. When a rapid epitaxial growth is performed on the above silicon layer by a PVD method, silicon can be rapidly grown under clean conditions in which crystal defects are not formed. Since a sacrificial layer containing crystal defects can be selectively etched with a mixed solution containing hydrofluoric acid and an oxidizing agent, the lift-off can be preferably performed, and in addition, a high-purity monocrystalline silicon thin film used as a photovoltaic layer of solar cells can be obtained.

In addition, as the sacrificial layer described above, highly doped monocrystalline silicon may be used.

In the case described above, as a dopant doped in the highly doped monocrystalline silicon thin film, for example, an element of group III or V may be used.

In addition, the dopant concentration of the highly doped monocrystalline silicon thin film may be set to $10^{18}$ atoms/cm$^3$ or more.

Furthermore, by supplying a dopant source onto the surface of the monocrystalline silicon substrate, a highly doped monocrystalline silicon sacrificial layer may be formed.

In addition, by simultaneously supplying a silicon source and a dopant source onto the monocrystalline silicon substrate, a highly doped monocrystalline silicon sacrificial layer may be formed.

Furthermore, by supplying a silicon source and a dopant source onto the monocrystalline silicon substrate while the ratio between the above two sources is controlled with time, a highly doped layer and a lightly doped layer are formed in a silicon film which is rapidly formed by epitaxial growth, and the former may be used as the sacrificial layer and the latter may be used as the monocrystalline silicon thin film for a photovoltaic layer of solar cells.

In addition, as the sacrificial layer, compound crystal containing silicon may be used. In the case described above, as the compound crystal containing silicon, for example, a metal silicide such as $CoSi_2$, $NiSi_2$, or $CrSi_2$ may be used.

In addition, as the sacrificial layer, crystal containing no silicon may be used.

In addition, when the sacrificial layer is etched using an aqueous solution containing hydrofluoric acid, the monocrystalline silicon thin film used as a photovoltaic layer of solar cells may be manufactured.

Furthermore, after being formed, the monocrystalline silicon thin film used as a photovoltaic layer of solar cells may be manufactured by the steps of supporting the monocrystalline silicon thin film used as a photovoltaic layer of solar cells by a support base material, and then etching the silicon sacrificial layer.

In addition, in the method for manufacturing a monocrystalline silicon thin film used as a photovoltaic layer of solar cells, holes may be formed in the monocrystalline silicon substrate at intervals.

Furthermore, in the method for manufacturing a monocrystalline silicon thin film used as a photovoltaic layer of solar cells, a texture structure may be formed on the surface of the monocrystalline silicon substrate.

In the method for manufacturing a monocrystalline silicon thin film used as a photovoltaic layer of solar cells, in addition to improvement in productivity, the time for exposing the entire substrate to a high temperature is decreased by increasing the epitaxial growth rate of the monocrystalline silicon thin film using a RVD method. Accordingly, the change in structure of the sacrificial layer can be suppressed, the monocrystalline silicon thin film and the monocrystalline silicon substrate can be preferably separated from each other by selective etching of the sacrificial layer, and as a result, a high-purity monocrystalline silicon thin film containing a small number of defects can be obtained; hence, the method described above is a very promising process. In addition, besides the monocrystalline silicon, the method described above may be applied to manufacturing of a monocrystalline thin film using another optional material, such as Ge, GaAs, GaN, and GeN.

In particular, in the case in which a monocrystalline silicon thin film having a texture structure thereon is used, when it is used as a photovoltaic layer of solar cells, solar light can be efficiently brought into the monocrystalline thin film, and hence the energy conversion efficiency can be improved.

Figure 21:
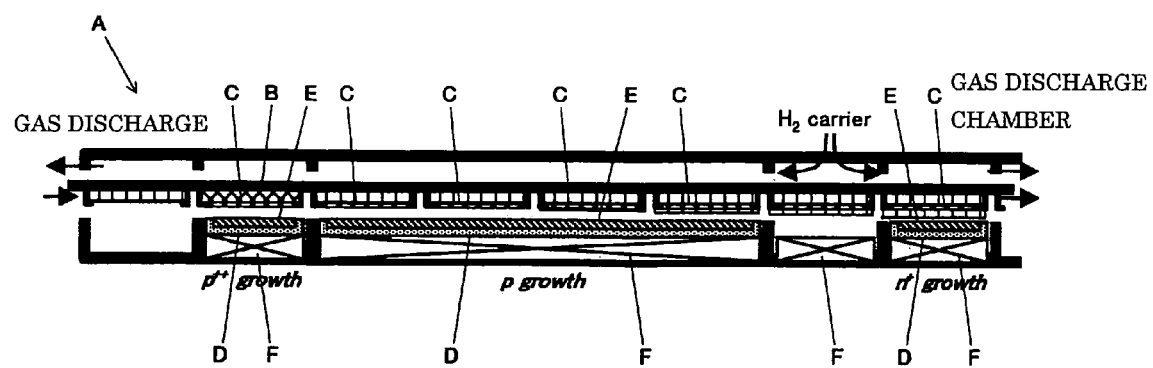
FIG. 21 is a schematic view of a high-throughput deposition (doped-layer forming) apparatus of an example according to the present invention.
Figure 22:
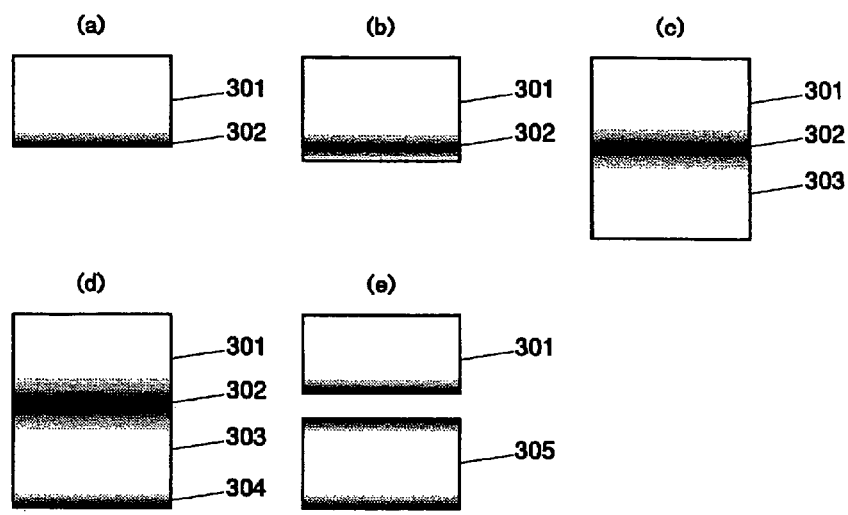
FIG. 22 includes cross-sectional views of a photovoltaic layer of solar cells formed along the flow performed by a high-throughput deposition apparatus of an example according to the present invention.

FIG. 21 is a schematic view of a high-throughput deposition (doped-layer forming) apparatus of an example according to the present invention, and FIG. 22 includes cross-sectional views of manufacturing steps of a photovoltaic layer of solar cells along a process flow performed by the high-throughput deposition apparatus described above.

In FIG. 21, A indicates a high-throughput deposition apparatus (reaction furnace), B indicates a susceptor (made of graphite or the like), C indicates a silicon substrate, D indicates a crucible (made of quartz or the like), E indicates a silicon solution, and F indicates a heating device (electric heating device, induction heating device, electron beam heating device or the like). Since being a conveyor system using the susceptor B, this high-throughput deposition apparatus is formed so that a highly doped layer and a photovoltaic layer of solar cells (including p/n junctions) can be continuously formed. In addition, as the manufacturing apparatus, back diffusion of impurities is prevented by differential pumping with a $H_2$ carrier gas flow, and in addition, pre-heating can also be performed.

In a manufacturing process of the photovoltaic layer of solar cells, first, as shown in FIG. 22(a), on the surface of a monocrystalline silicon substrate 301, a monocrystalline silicon $p^{++}$ layer 302 is grown, and next, as shown in FIGS. 22(b) and 22(c), a monocrystalline silicon p layer 303 is formed by a rapid epitaxial growth using a PVD method. The monocrystalline silicon p layer 303 and the monocrystalline silicon $p^{++}$ layer 302 are formed by a vapor-phase growth method in which B or $B_2H_6$ is added to Si. Next, as shown in FIG. 22(d), an $n^+$ layer 304 is formed on the surface of the monocrystalline silicon p layer 303. This $n^+$ layer 304 is formed by in-situ doping (a desired dopant is simultaneously doped into a film while it is formed in the same reaction furnace), that is, is formed by a vapor-phase growth method in which P or $PH_3$ is added to Si.

As described above, a laminate substrate including the $n^+$ layer 304, the p layer 303, the $p^{++}$ layer 302, and the Si substrate 301, which are continuously formed using the high-throughput deposition apparatus, is removed from the apparatus, and as shown in FIG. 22(e), etching of the $p^{++}$ layer (highly doped layer) 302 is performed using an aqueous solution containing hydrofluoric acid, so that a monocrystalline silicon thin film 305 used as a photovoltaic layer of solar cells can be manufactured.

Figure 23:
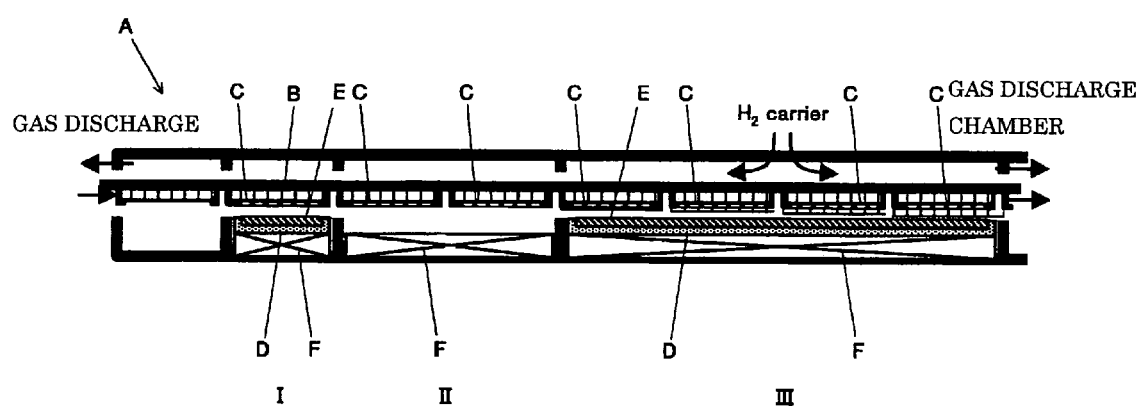
FIG. 23 is a schematic view of a high-throughput deposition (defect containing-layer forming) apparatus of an example according to the present invention.

FIG. 23 is a schematic view of a high-throughput deposition (defect containing-layer forming) apparatus of an example according to the present invention.

Also in FIG. 23, the apparatus is formed so that by a conveyor system using a graphite susceptor B as is the case shown in FIG. 21, the formation of a defect containing layer, the elimination of surface defects, and the formation of a photovoltaic layer (including p/n junctions) can be continuously carried out. In addition, as the manufacturing apparatus, back diffusion of impurities is prevented by differential pumping with a H2 carrier gas flow, and in addition, pre-heating can also be performed.

In a manufacturing process of a photovoltaic layer of solar cells, first, in a process block I, epitaxial growth of defect-containing layer is performed in an atmosphere at a temperature of 800 to 1,200° C., annealing is then performed in a process block II at a temperature of 1,000 to 1,400° C., and subsequently, rapid epitaxial growth is performed in a process block III by a PVD method, so that high-quality epitaxial growth of the photovoltaic layer of solar cells is performed.

The defect containing layer and the photovoltaic layer of solar cells obtained by continuous film formation using the high-throughput deposition apparatus as described above are removed therefrom, followed by etching of the defect containing layer using an aqueous solution containing hydrofluoric acid, so that the monocrystalline silicon thin film used as a photovoltaic layer of solar-cells can be manufactured.

In particular, by a PVD method, a photovoltaic layer of solar cells is formed so as to have a thickness of 10 µm within 1 to 10 minutes. Hence, deposition is performed at a high temperature.

On the other hand, in a CVD method, since elements other than silicon adsorb on the growing surface together with silicon, the desorption rate of the above elements may determine an upper limit of the film growth rate. For example, in a typical CVD method using a chlorosilane, the desorption of chlorine or hydrogen determines the reaction rate, and the upper limit of the growth rate is determined thereby. In other words, the time required for epitaxial growth of a monocrystalline silicon thin film has an upper limit, and within this time, the change in structure of the sacrificial layer and the diffusion of elements from the sacrificial layer to the monocrystalline silicon thin film and the substrate occur, thereby causing the above problems.

Under the current circumstances described above, according to the present invention, a method for increasing the film growth rate by a PVD method was invented. That is, when only silicon is supplied to a growing surface, the desorption of other elements such as chlorine and hydrogen will not occur, and hence the film growth rate is not determined by an upper limit rate of the desorption rate-determining step. The upper limit of the film growth rate by a PVD method is determined by the time required for supplied silicon to travel to an epitaxial position on a monocrystalline silicon substrate or a film surface. Actually, when silicon was supplied to a surface of a monocrystalline silicon substrate at a substrate temperature of 800° C. by a PVD method, epitaxial growth at a film growth rate of 10 µm/min was confirmed. In order to obtain the same film growth rate as described above by a CVD method, since the temperature must be increased to approximately 1,200° C., it is now understood that the substrate temperature can be decreased by 400° C. Because of the decrease in temperature by 400° C., the diffusion rate can be decreased to 1/20,000.

As described above, according to the present invention, a three-layered structure composed of the monocrystalline silicon thin film, the sacrificial layer, and the monocrystalline silicon substrate can be formed without degrading the sacrificial layer, and as a result, the monocrystalline silicon thin film can also be manufactured.

The present invention is not limited to the examples described above, and various modifications may be performed without departing from the spirit and the scope of the present invention and may not be excluded therefrom.

According to the present invention, the lift-off of the monocrystalline silicon film can be preferably performed, and a high-purity monocrystalline silicon film containing a small number of defects can be obtained.

Accordingly, the cost of a solar cell can be significantly reduced.

In particular, since the cost of a bulk crystal silicon module used in a solar-cell power generation system for home use is two thirds of the total cost thereof, and the cost of manufacturing of a crystal silicon substrate used in the bulk crystal silicon module is 40% of the cost thereof, the amount of high-purity silicon used for the substrate can be significantly decreased to 1/10 to 1/100.

In addition, the current apparent problem, that is, shortage of high-purity silicon, can also be solved. Furthermore, when the cost can be reduced to a level competitive to a system power source, the use of solar cells may widely spread without having any political support, and significant expansion of solar cell market can be expected.

INDUSTRIAL APPLICABILITY

The present invention is suitably applied, for example, to methods for manufacturing photovoltaic layers of solar cells and monocrystalline thin films of silicon and compound semiconductors used for semiconductor devices and to methods for manufacturing SOI substrates.

The invention claimed is:

1. A method for manufacturing a monocrystalline thin film, comprising;
   (a) preparing a monocrystalline substrate;
   (b) forming a sacrificial layer containing crystal defects on the monocrystalline substrate using the same material by epitaxial growth;
   (c) forming a monocrystalline thin film containing crystal defects on the sacrificial layer using the same material by epitaxial growth, the number of the crystal defects being smaller than that of the sacrificial layer; and
   (d) etching the sacrificial layer so as to form a monocrystalline thin film containing a small number of crystal defects.

2. The method for manufacturing a monocrystalline thin film, according to claim 1, further comprising eliminating crystal defects present on the surface of the sacrificial layer following the (b).

3. The method for manufacturing a monocrystalline thin film, according to claim 1, wherein the monocrystalline substrate is a monocrystalline silicon substrate, the sacrificial layer is a silicon sacrificial layer, and the monocrystalline thin film is a monocrystalline silicon thin film.

4. The method for manufacturing a monocrystalline thin film, according to claim 1, wherein the monocrystalline substrate is a monocrystalline GaAs substrate.

5. The method for manufacturing a monocrystalline thin film, according to claim 1, wherein the monocrystalline substrate is a monocrystalline MgO substrate.

6. The method for manufacturing a monocrystalline thin film, according to claim 1, wherein the (b) is performed by a physical vapor deposition method or a chemical vapor deposition method at a temperature of 400 to 1,200° C., whereby a silicon sacrificial layer containing crystal defects is epitaxially-grown.

7. The method for manufacturing a monocrystalline thin film, according to claim 3, wherein the crystal defects comprise twins, vacancies, interstitial atoms, edge displacements, or screw displacements.

8. The method for manufacturing a monocrystalline thin film, according to claim 3, wherein the number density of the crystal defects is $1/\mu m^2$ to $1/nm^2$ at a boundary between the monocrystalline silicon substrate and the silicon sacrificial layer.

9. The method for manufacturing a monocrystalline thin film, according to claim 3, wherein twins exist at a boundary between the monocrystalline silicon substrate and the silicon sacrificial layer at a number density of $1/\mu m^2$ to $1/nm^2$.

10. The method for manufacturing a monocrystalline thin film, according to claim 3, further comprising, following the (b), performing thermal annealing in a reducing atmosphere at a temperature of 1,000 to 1,400° C. to eliminate crystal defects on a surface of the silicon sacrificial layer.

11. The method for manufacturing a monocrystalline thin film, according to claim 10, wherein after the thermal annealing, a number density of twins present on the surface of the silicon sacrificial layer is one hundredth or less of a number density of twins present at a boundary between the monocrystalline silicon substrate and the silicon sacrificial layer.

12. The method for manufacturing a monocrystalline thin film, according to claim 3, wherein the (c) is performed by a physical vapor deposition method or a chemical vapor deposition method at a temperature of 1,000 to 1,400° C., whereby the monocrystalline silicon thin film containing a small number of crystal defects is formed by epitaxial growth.

13. The method for manufacturing a monocrystalline thin film, according to claim 3, further comprising, following the (c), supporting the monocrystalline silicon thin film by a support base material, and then etching the silicon sacrificial layer so as to manufacture the monocrystalline silicon thin film.

14. The method for manufacturing a monocrystalline thin film, according to claim 3, further comprising forming holes in the monocrystalline silicon substrate at intervals.

15. The method for manufacturing a monocrystalline thin film, according to claim 3, wherein a thickness of the silicon sacrificial layer is set to 100 nm or less so that a roughness of a bottom surface of the monocrystalline silicon thin film is reduced to 100 nm or less.

16. The method for manufacturing a monocrystalline thin film, according to claim 3, wherein a thickness of the silicon sacrificial layer is set to 100 nm or more so that a bottom surface of the monocrystalline silicon thin film has a texture structure of 100 nm or more.

17. The method for manufacturing a monocrystalline thin film, according to claim 3, further comprising forming a texture structure on a the surface of the monocrystalline silicon substrate.

18. The method for manufacturing a monocrystalline thin film, according to claim 3, wherein the etching of the silicon sacrificial layer is performed with a mixed solution of hydrofluoric acid and an oxidizing agent.

19. A monocrystalline thin film device obtained by the method for manufacturing a monocrystalline thin film, according to claim 1.

20. A monocrystalline thin film device obtained by the method for manufacturing a monocrystalline silicon thin film, according to claim 3.

21. The monocrystalline thin film device according to claim 20, wherein the monocrystalline silicon thin film is a photovoltaic layer of solar-cells.

22. The monocrystalline thin film device according to claim 20, wherein the monocrystalline silicon thin film is a monocrystalline silicon thin film of SOI.

23. A method for manufacturing a solar-cell monocrystalline silicon thin film, comprising;
   (a) preparing a monocrystalline silicon substrate;
   (b) forming an epitaxial sacrificial layer on the substrate;
   (c) rapidly forming a monocrystalline silicon thin film containing a smaller number of crystal defects than the sacrificial layer on the sacrificial layer by epitaxial growth using the same material as that of the sacrificial layer; and
   (d) etching the sacrificial layer so as to manufacture a monocrystalline silicon thin film to form a photovoltaic layer in a solar-cell.

24. The method for manufacturing a solar-cell monocrystalline silicon thin film, according to claim 23, wherein the rapid epitaxial growth of the monocrystalline silicon thin film is performed by a physical vapor deposition.

25. The method for manufacturing a solar-cell monocrystalline silicon thin film, according to claim 23, wherein the sacrificial layer is a crystal silicon comprising crystal defects.

26. The method for manufacturing a solar-cell monocrystalline silicon thin film, according to claim 25, wherein the crystal defects have twins, vacancies, interstitial atoms, edge displacements, or screw displacements.

27. The method for manufacturing a solar-cell monocrystalline silicon thin film, according to claim 25, wherein a number density of the crystal defects is in a range from $1/\mu m^2$ to $1/nm^2$ at a boundary between the monocrystalline silicon substrate and the silicon sacrificial layer.

28. The method for manufacturing a solar-cell monocrystalline silicon thin film, according to claim 24, further comprising eliminating crystal defects present on a surface of the sacrificial layer following the (b).

29. The method for manufacturing a solar-cell monocrystalline silicon thin film, according to claim 23, wherein the sacrificial layer has highly doped monocrystalline silicon.

30. The method for manufacturing a solar-cell monocrystalline silicon thin film, according to claim 29, wherein a dopant doped in the highly doped monocrystalline silicon is an element of group III or V.

31. The method for manufacturing a solar-cell monocrystalline silicon thin film, according to claim 29, wherein a dopant concentration of the highly doped monocrystalline silicon is $10^{18}$ atoms/cm$^3$ or more.

32. The method for manufacturing a solar-cell monocrystalline silicon thin film, according to claim 29, wherein a dopant source is supplied onto a surface of the monocrystalline silicon substrate, whereby the highly doped monocrystalline silicon sacrificial layer is formed.

33. The method for manufacturing a solar-cell monocrystalline silicon thin film, according to claim 29, wherein a silicon source and a dopant source are simultaneously supplied onto the monocrystalline silicon substrate, whereby the highly doped monocrystalline silicon sacrificial layer is formed.

34. The method for manufacturing a solar-cell monocrystalline silicon thin film, according to claim 29, wherein a silicon source and a dopant source are supplied onto the monocrystalline silicon substrate while a ratio between the two sources is controlled with time so as to form a highly doped layer and a lightly doped layer in a silicon film which is rapidly epitaxially-grown, and the former is used as the sacrificial layer and the latter is used as the monocrystalline silicon thin film for a photovoltaic layer of solar cells.

35. The method for manufacturing a solar-cell monocrystalline silicon thin film, according to claim 23, wherein the sacrificial layer comprises a compound crystal having silicon.

36. The method for manufacturing a solar-cell monocrystalline silicon thin film, according to claim 35, wherein the compound crystal having silicon is a metal silicide comprising $CoSi_2$, $NiSi_2$, or $CrSi_2$.

37. The method for manufacturing a solar-cell monocrystalline silicon thin film, according to claim 23, wherein the sacrificial layer comprises a crystal containing no silicon.

38. The method for manufacturing a solar-cell monocrystalline silicon thin film, according to claim 23, wherein the sacrificial layer is etched with an aqueous solution comprising hydrofluoric acid, whereby the monocrystalline silicon thin film used as a photovoltaic layer of solar cells is manufactured.

39. The method for manufacturing a solar-cell monocrystalline silicon thin film, according to claim 23, further comprising, following the (c), supporting the monocrystalline silicon thin film used as a photovoltaic layer of solar cells by a support base material, and then etching the silicon sacrificial layer, whereby the monocrystalline silicon thin film used as a photovoltaic layer of solar cells is manufactured.

40. The method for manufacturing a solar-cell monocrystalline silicon thin film, according to claim 23, further comprising forming holes in the monocrystalline silicon substrate at intervals.

41. The method for manufacturing a solar-cell monocrystalline silicon thin film, according to claim 23, further comprising forming a texture structure on a surface of the monocrystalline silicon substrate.

42. A monocrystalline silicon thin film solar cell obtained by the method for manufacturing a solar-cell monocrystalline silicon thin film according to claim 23.

* * * * *